US011747400B2

(12) United States Patent
Dosado

(10) Patent No.: US 11,747,400 B2
(45) Date of Patent: Sep. 5, 2023

(54) METHOD OF CONVERTING A SERIAL VECTOR FORMAT (SVF) FILE TO A VECTOR COMPATIBLE WITH A SEMICONDUCTOR TESTING SYSTEM

(71) Applicant: The United States of America, as represented by the Secretary of the Navy, Crane, IN (US)

(72) Inventor: Daniel M. Dosado, Bloomington, IN (US)

(73) Assignee: The United States of America, as Represented by the Secretary of the Navy, Washington, DC (US)

(*) Notice: Subject to any disclaimer, the term of this patent is extended or adjusted under 35 U.S.C. 154(b) by 0 days.

(21) Appl. No.: 17/869,186

(22) Filed: Jul. 20, 2022

(65) Prior Publication Data

US 2023/0027456 A1    Jan. 26, 2023

Related U.S. Application Data

(60) Provisional application No. 63/223,576, filed on Jul. 20, 2021.

(51) Int. Cl.
*G01R 31/3185* (2006.01)
*G01R 31/3183* (2006.01)

(52) U.S. Cl.
CPC ........ *G01R 31/318555* (2013.01); *G01R 31/318314* (2013.01); *G01R 31/318519* (2013.01); *G01R 31/318572* (2013.01)

(58) Field of Classification Search
CPC .... G01R 31/318555; G01R 31/318314; G01R 31/318519; G01R 31/318572

USPC ........................................................ 714/727
See application file for complete search history.

(56) References Cited

U.S. PATENT DOCUMENTS

| | | | | |
|---|---|---|---|---|
| 6,882,950 B1* | 4/2005 | Jennion | ............... | G06F 11/263 714/25 |
| 6,941,243 B1* | 9/2005 | Maciona | ............... | G06F 11/263 702/182 |
| 7,139,949 B1* | 11/2006 | Jennion | ............... | G06F 11/2236 714/E11.166 |

(Continued)

*Primary Examiner* — John J Tabone, Jr.
(74) *Attorney, Agent, or Firm* — Naval Surface Warfare Center, Crane Division; Christopher Feigenbutz; Patrick B. Law

(57) ABSTRACT

Provided is a method for enabling a semiconductor test system for testing field programmable gate arrays (FPGAs) to operate as a device programmer by converting a serial vector format (SVF) file containing a bitstream and converting the file to a vector compatible with the semiconductor test system. When executed on an HP93K test system, as an example, the vector generates JTAG (Joint Test Action Group) signals, which program the bitstream into a Field Programmable Gate Array (FPGA). The inventive method eliminates the need for a separate computer system that is normally required to run FPGA programming software and also eliminates the need to use FPGA vendor provided JTAG programming pods. Eliminating the need for the vendor software, a separate computer system, and programming pods reduces equipment cost, maintenance, and streamlines the electrical test, evaluation, and characterization of FPGAs.

20 Claims, 25 Drawing Sheets

(56) References Cited

U.S. PATENT DOCUMENTS

| | | | |
|---|---|---|---|
| 2003/0140291 A1* | 7/2003 | Brown | G01R 31/318555 714/724 |
| 2004/0064764 A1* | 4/2004 | Gomez | G01R 31/31907 714/47.1 |
| 2005/0097416 A1* | 5/2005 | Plunkett | G01R 31/318547 714/727 |
| 2023/0027456 A1* | 1/2023 | Dosado | G01R 31/318572 |

* cited by examiner

```
FORMAT TCK TMS TDI TDO:
R1 cyc  1   0   1   X ⎫
R1 cyc  1   0   0   X ⎪  "Vector_nibble_text" generated will shift 0x1010b on the TDI pin, which corresponds
R1 cyc  1   0   1   X ⎬  to the first hexadecimal character, '5' in the hexadecimal string "5599AAh".
R1 cyc  1   0   0   X ⎪
R1 cyc  1   0   1   X ⎭
R1 cyc  1   0   1   X ⎫
R1 cyc  1   0   0   X ⎪  "Vector_nibble_text" generated will shift 0x1010b on the TDI pin, which corresponds
R1 cyc  1   0   1   X ⎬  to the second hexadecimal character, '5' in the hexadecimal string "5599AAh".
R1 cyc  1   0   0   X ⎪
R1 cyc  1   0   1   X ⎭
R1 cyc  1   0   1   X ⎫
R1 cyc  1   0   0   X ⎪  "Vector_nibble_text" generated will shift 0x1001b on the TDI pin, which corresponds
R1 cyc  1   0   0   X ⎬  to the third hexadecimal character, '9' in the hexadecimal string "5599AAh".
R1 cyc  1   0   0   X ⎪
R1 cyc  1   0   1   X ⎭
R1 cyc  1   0   1   X ⎫
R1 cyc  1   0   0   X ⎪  "Vector_nibble_text" generated will shift 0x1001b on the TDI pin, which corresponds
R1 cyc  1   0   0   X ⎬  to the fourth hexadecimal character, '9' in the hexadecimal string "5599AAh".
R1 cyc  1   0   0   X ⎪
R1 cyc  1   0   1   X ⎭
R1 cyc  1   0   1   X ⎫
R1 cyc  1   0   0   X ⎪  "Vector_nibble_text" generated will shift 0x0101b on the TDI pin, which corresponds
R1 cyc  1   0   1   X ⎬  to the fifth hexadecimal character, 'A' in the hexadecimal string "5599AAh".
R1 cyc  1   0   0   X ⎪
R1 cyc  1   0   1   X ⎭
R1 cyc  1   0   1   X ⎫
R1 cyc  1   0   0   X ⎪  "Vector_nibble_text" generated will shift 0x0101b on the TDI pin, which corresponds
R1 cyc  1   0   1   X ⎬  to the last hexadecimal character, 'A' in the hexadecimal string "5599AAh".
R1 cyc  1   0   0   X ⎪
R1 cyc  1   0   1   X ⎭
```

```
          R1 cyc 1 0 1 X
0x1h  =   R1 cyc 1 0 0 X
          R1 cyc 1 0 0 X
          R1 cyc 1 0 0 X
                   /        ╲
                  /          ─1002
           TMS signal column
```

FIG. 10

```
FORMAT  TCK  TMS  TDI  TDO;
R1 cyc   1    1    0    X;
R1 cyc   1    1    0    X;
R1 cyc   1    1    0    X;
R1 cyc   1    1    0    X;
R1 cyc   1    1    0    X;
R1 cyc   1    0    0    X;
```

FIG. 11

METHOD OF CONVERTING A SERIAL VECTOR FORMAT (SVF) FILE TO A VECTOR COMPATIBLE WITH A SEMICONDUCTOR TESTING SYSTEM

CROSS-REFERENCE TO RELATED APPLICATIONS

The present application claims priority to U.S. Provisional Patent Application Ser. No. 63/223,576, filed Jul. 20, 2022, and entitled "METHOD OF CONVERTING A SERIAL VECTOR FORMAT (SVF) FILE TO AN HP93K VECTOR," the disclosure of which is expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 210067US02) is assigned to the United States Government and is available for licensing for commercial purposes. Licensing and technical inquiries may be directed to the Technology Transfer Office, Naval Surface Warfare Center Crane, email: Cran_CTO@navy.mil.

FIELD OF INVENTION

The field of invention relates generally to semiconductor test systems. More particularly, the field of invention pertains to methods of enabling a semiconductor testing system to operate as a device programmer by converting a Serial Vector Format file containing a bitstream to a vector compatible with the semiconductor testing system.

BACKGROUND

Field programmable gate array (FPGA) vendors produce device programming hardware, such as programming pods and software for the purpose of programming their FPGAs. Using vendor supplied hardware typically requires connecting a programming pod to the circuit board of the FPGA, and then connecting that programming pod by USB or serial cable to an additional computer. Vendor supplied software must also be installed and running on the additional computer. A user must then manually operate the software to program the FPGA, or may sometimes be able to write a script to automate the vendor software to program the FPGA. Electrically testing an FPGA using a semiconductor or chip testing system such as an HP 93000 (i.e., HP93K) tester, for example, requires several different bitstreams in order to condition the FPGA to be in an appropriate state for a particular test. For example, testing the FPGA with one half of its Input/Output (I/O) pins configured as input pins requires a bitstream to configure those I/O pins as inputs, but testing the FPGA with those same I/O pins configured as output pins requires a completely different bitstream to reconfigure those pins as output pins. Depending on the level of testing and electrical characterization desired, it may be necessary to load hundreds of bitstreams into a single FPGA.

Furthermore, using vendor supplied hardware and software to program an FPGA that is connected to the HP93K tester may present several problems. First, electrical testing of FPGAs is usually performed at extreme temperatures ranging from −5° C. to +125° C., whereas the vendor programming pod, especially the ribbon cable, may only have an operating temperature ranging from 0° C. to +70° C. To facilitate testing and to reduce the temperature soak time, the HP93K operator may wish to leave the vendor programming pod connected to the FPGA inside of a temperature forcing chamber for the duration of the tests. The vendor programming pod, however, may break down prematurely if subjected to the same temperature conditions as the FPGA under test. As such, there is a need for methods that avoid this problem by eliminating the need to even introduce the programming pod into the testing environment.

Additionally, information assurance (IA) prioritizes computer and network security. The vendor software may sometimes be automated by executing a script issued from the HP93K workstation to the additional computer running the vendor software, and this script may issue commands to the additional computer via an Ethernet port, a serial port, or another interface. However, if an IA mandate prohibits an Ethernet or serial port connection between the HP93K workstation and the additional computer, then the script will no longer work and the end user will have no choice but to manually operate the software to program the FPGA. As such, there is a need to avoid this problem by producing an HP93K vector that can replace both the additional computer and the programming software in the FPGA test setup. Instead of issuing a command to an external computer, there is an unmet need for an HP93K tester to instead execute a vector stored on its workstation to program the bitstream into the FPGA directly.

Furthermore, even in the best case scenario where the vendor software on the additional computer can be automated, there is a significant cost to procure the additional computer and administer IA patches and updates. Using the additional computer to perform the FPGA test makes that additional computer unavailable for other value added tasks, such as report writing, design work, data analysis, etc. By offloading the programming task from the additional computer to the HP93K tester, the extra computer would readily available for more value-added tasks.

SUMMARY

The present invention overcomes the problems described above by providing a method for enabling a semiconductor test system to also operate as a device programmer. The method includes converting a serial vector format (SVF) file containing a bitstream to a vector compatible with the semiconductor testing system such as an HP93K vector. When executed on an HP93K tester, for example, the vector generates Joint Test Action Group (JTAG) signals that program the bitstream into the field programmable gate array (FPGA). The inventive methods eliminate the need for separate computer systems that are normally required to run FPGA programming software and eliminates the need to use an FPGA vendor JTAG programming pod. Eliminating the need for the vendor software, a separate computer system, and a programming pod reduces equipment cost, maintenance, and streamlines the electrical test, evaluation, and characterization of FPGAs.

Additional features and advantages of the present invention will become apparent to those skilled in the art upon consideration of the following detailed description of the illustrative embodiments, which include embodiments exemplifying a best mode of carrying out the invention as presently perceived.

BRIEF DESCRIPTION OF THE DRAWINGS

The detailed description of the drawings particularly refers to the accompanying figures in which:

FIG. 5 shows a series of vectors that will shift in a nibble of data for each hexadecimal character in the bitstream according to aspects of the present disclosure.

FIG. 10 shows a "Vector_nibble_text" variable composed of four HP93K vector cycles according to aspects of the present disclosure.

FIG. 11 shows a JTAG RESET vector according to aspects of the present disclosure.

DETAILED DESCRIPTION

The embodiments of the invention described herein are not intended to be exhaustive or to limit the invention to the precise forms disclosed. Rather, the embodiments selected for description have been chosen to enable one skilled in the art to practice the invention.

The present invention provides for methods to enable a semiconductor test system, such as an HP93K system, to also operate as a device programmer. In some aspects, the disclosed methodologies include converting a Serial Vector Format (SVF) file containing a bitstream to a vector compatible with the test system, such as an HP93K vector. When executed on an HP93K tester, the vector generates Joint Test Action Group (JTAG) signals that program the bitstream into the Field Programmable Gate Array (FPGA). The present inventive methods eliminate the need for separate computer systems that are normally required to run FPGA programming software and eliminates the need to use an FPGA vendor JTAG programming pod. Eliminating the need for the vendor software, a separate computer system, and a programming pod reduces equipment cost, maintenance, and streamlines the electrical test, evaluation, and characterization of FPGAs. It is noted that while the present disclosure illustrates examples pertaining the HP93K test systems, the methods disclosed herein are also applicable to other similar systems that utilize vectors and digital signals, such a Teradyne Microflex testing system as merely one example.

Figure 1:
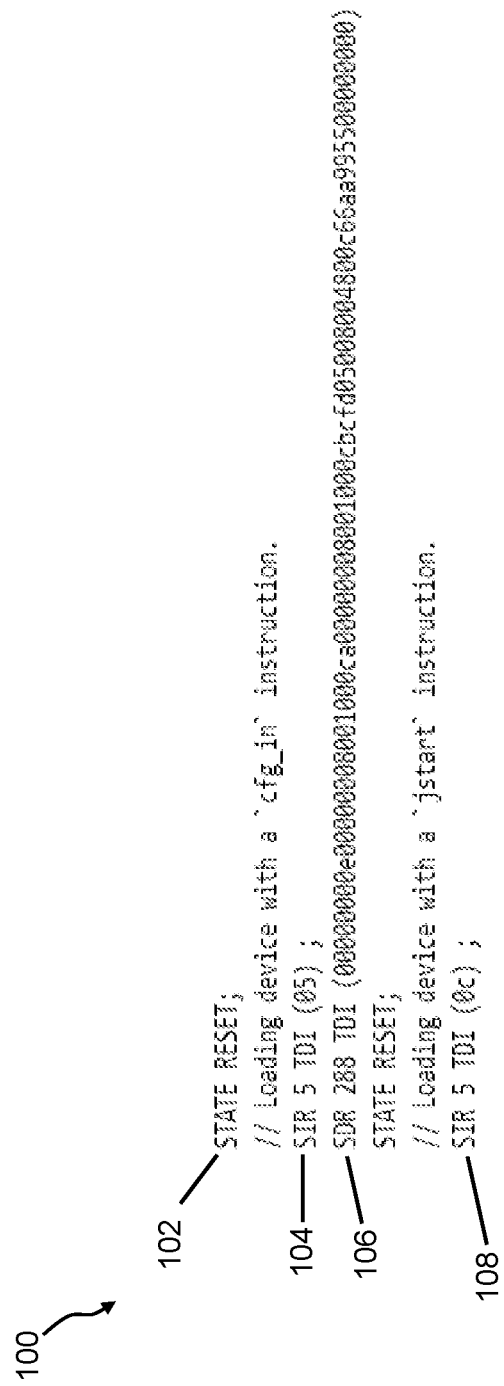
FIG. 1 shows an excerpt from an SVF file according to aspects of the present disclosure.

In order to explain how software converts an SVF file to an HP93K vector, a brief overview of the components of an SVF file, as well as the components of an HP93K vector file will be discussed. FIG. 1 illustrates an excerpt from an SVF file shown at 100. A first entry 102 (i.e., "STATE RESET") is a boundary scan description language (BSDL)/JTAG instruction that instructs a programming pod to issue JTAG signals to place the JTAG state machine of the FPGA into a "Test Logic Reset" state. The next entry 104 "SIR 5 TDI (05)", loads a Configuration Load instruction into the FPGA. The instruction does this by instructing the JTAG state machine to transition to the "Shift Instruction Register" state, "SIR", and to shift five bits of data, represented in hexadecimal as "05" onto the "TDI" pin of the FPGA. It is noted that in this example, the hexadecimal value of "05" is the BSDL configuration load instruction for this particular FPGA and this may be different for other FPGAs. A third entry 106, shown as "SDR 288 TDI (000 . . . ", instructs the JTAG state machine to transition to the "Shift Data Register" state, "SDR", and to shift 288 bits of configuration data, represented in hexadecimal as "00000000e00000008001000ca00000008001000cbcfd0500 8004800c66aa995500000000" onto the "TDI" pin of the FPGA. A fourth entry 108, "SIR 5 TDI (0c)", instructs the JTAG state machine to transition to the "Shift Instruction Register" state, and loads the hexadecimal instruction "0c" onto the TDI pin of the FPGA. For this particular FPGA, the configuration load instruction 104, "SIR 5 TDI (05)" always precedes a "Shift Data Register" state, followed by bitstream data enclosed between open and closed parentheses.

Figure 2:
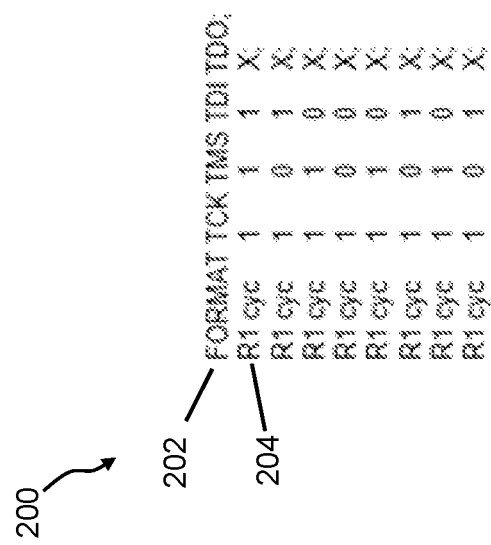
FIG. 2 shows a small segment of text from an HP93K ASCII vector file according to aspects of the present disclosure.

Referring now to FIG. 2, this figure illustrates a small segment of text from an HP93K ASCII vector file shown at 200. A first entry 202 is the format line, which contains the pin names of the FPGA that will be controlled by the vector. The next entry 204 indicates the waveform indices that will be activated on the HP93K tester for each tester period. Each waveform index generates a specific waveform action, which control electrical signals generated by the HP93K tester. There are multiple ways to define the waveform action for a given waveform index. For this example, a waveform index of "1" for TCK will generate a single clock pulse and a waveform index of "1" for TMS and TDI will generate a logic high signal for the tester period, whereas a waveform index of "0" for TCK will generate a logic low and a waveform index of "0" for TMS and TDI will also generate a logic low for the tester period. Signal "TDO" is the only output in the group of JTAG pins. Its waveform actions consists of "0"—expect logic low, "1"—expect logic high, and "X"—don't care. No action is required on TDO for loading a bitstream, so its value is set to "X" for the entire vector. The value "R1" indicates the number of repetitions that will be executed. For clarity, all rows will only be executed once. The value "CYC" is a value known in the art of vector signaling, but and in the disclosed examples of the present methodology the value is kept as "CYC" for the entire vector.

Figure 3:
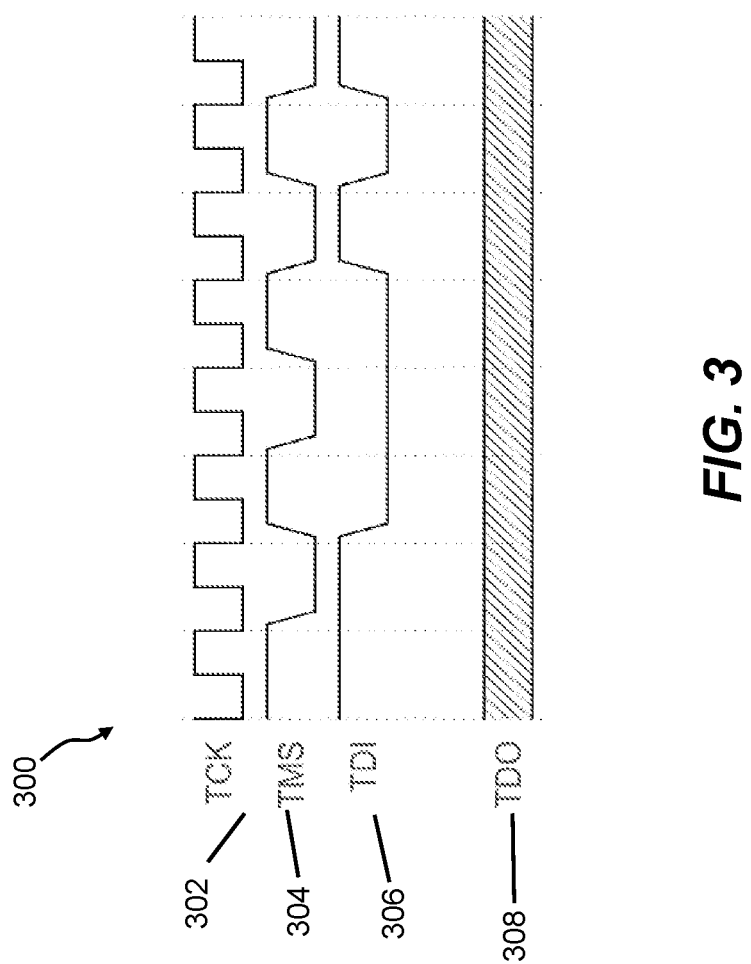
FIG. 3 illustrates signals that are generated by an HP93K tester hardware according to aspects of the present disclosure.

FIG. 3 shows an exemplary timing diagram 300 with the electrical signals that are generated on the HP93K tester hardware from the vector of FIG. 2 when paired with the waveform actions described above. The signals include a test clock (TCK) signal 302, a test mode select (TMS) signal 304, a test data input (TDI) signal 306, and test data output (TDO) signal 308.

The presently disclosed methodology, which may be implemented by a processor executing executable code or software, consists of at least two processes or steps. The first process is extracts a bitstream from an SVF and is named herein "bitstream_extractor." This process involves searching the SVF file for the BSDL configuration instruction. After finding an occurrence of the BSDL configuration instruction, the next step in the first process involves searching the text following the configuration instruction for the first occurrence of text that is enclosed between an open parenthesis "(" and a closed parenthesis ")." The text that is enclosed between the open and closed parentheses and that immediately follows a BSDL configuration instruction is a configuration bitstream. The first process then serves to extract this configuration bitstream and save it to a separate text file. There can be multiple bitstreams inside one SVF file and the first process serves to extract each bitstream and save each one to its own file. The first file is assigned a filename with a "0" appended to it as the suffix. For each subsequent file that is created the suffix is incremented to create a unique filename for each bitstream file.

The second process is a bitstream-to-vector conversion, which is named "bitstream2vector" as one exemplary nomenclature, and opens the text file(s) generated by the first process and parses the text, which is a series of hexadecimal characters. Each hexadecimal character represents four data bits, or a "nibble" of the FPGA bitstream. Thus, for each hexadecimal character the second process will generate a body of HP93K compatible vector text that represents four configuration data bits. This body of HP93K compatible vector text is herein referred to as "Vector_nibble_text."

Figure 4:
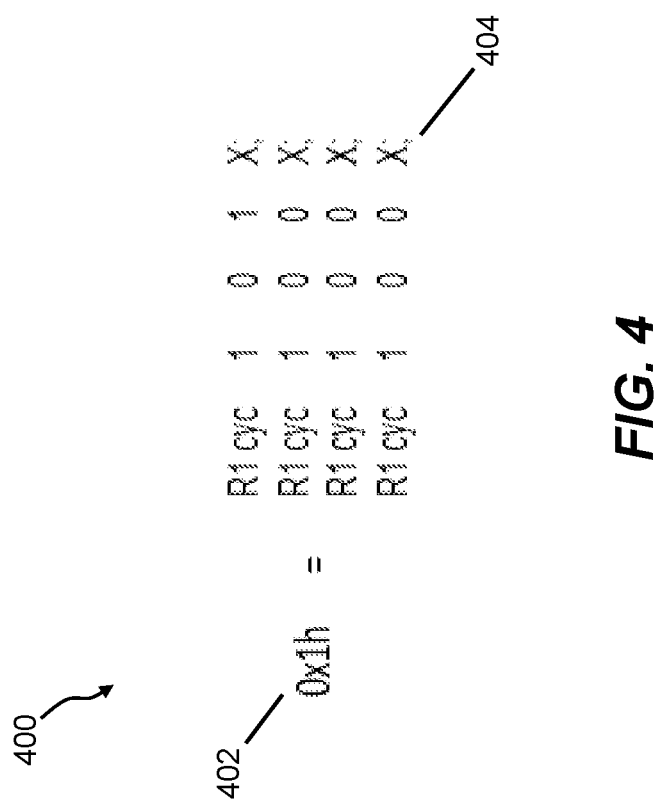
FIG. 4 shows an example of conversion of a hexadecimal value of "0x1h" to a corresponding HP93K "Vector_nibble_text" according to aspects of the present disclosure.

FIG. 4 shows an example 400 where the hexadecimal value of "0x1h" 402 is converted to a corresponding HP93K "Vector_nibble_text" 404. Each body of "Vector_nibble_text" that is generated is concatenated to the previous one until the entire hexadecimal text in the file has been converted. For example, if the hexadecimal string of "5599AAh" is present in the configuration bitstream inside the text file, the second process will convert this to an HP93K compatible vector text as shown in FIG. 5.

As illustrated at 500 in FIG. 5, each '1' value in the 'TCK' column is mapped to an HP93K waveform that will produce a clock pulse on the TCK signal input. A '0' value in the TMS and TDI columns is mapped to an HP93K waveform that will drive a logic low signal. Similarly, a '1' value in the TMS and TDI columns is mapped to an HP93K waveform that will drive a logic high signal. The data is shifted in serially starting with the Least Significant Bit first.

The vector text is then saved to an ASCII text file. When this file is converted to the HP93K binary format, merged into the HP93K vector set for an FPGA, and used with the appropriate pin configuration, levels setup, and timing setup for the HP93K, this vector text will load a bitstream into an FPGA. The existing HP93K vector set will already have BSDL vectors to place the JTAG state machine of the FPGA into the Test Logic Reset state, issue BSDL instructions to condition the FPGA to be ready to accept a configuration bitstream, and move the JTAG state machine of the FPGA into the "Shift Data Register", (Shift-DR) state.

Figure 6A:
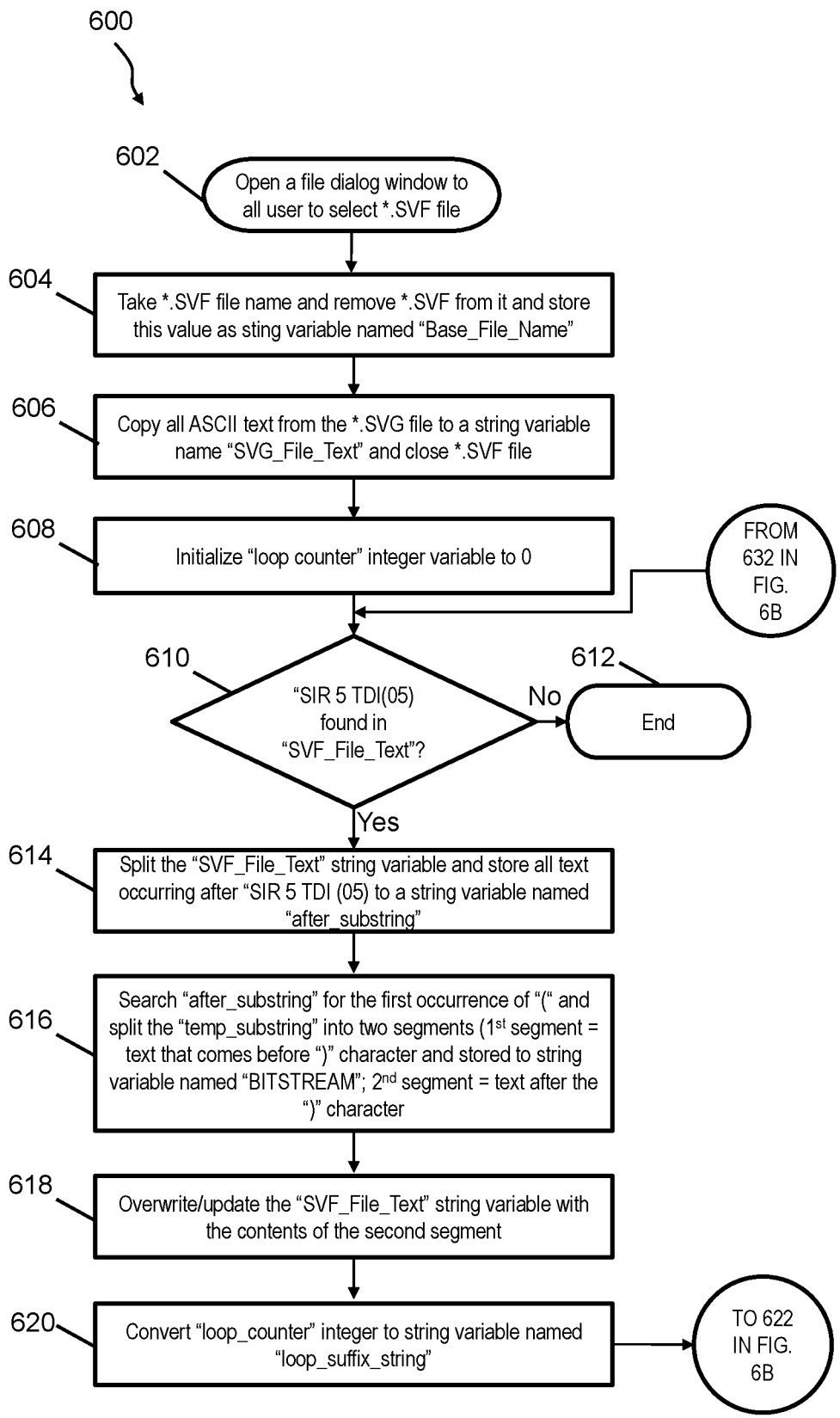
FIGS. 6A and 6B show a flow diagram of a bitstream extraction method or process according to aspects of the present disclosure.
Figure 6B:
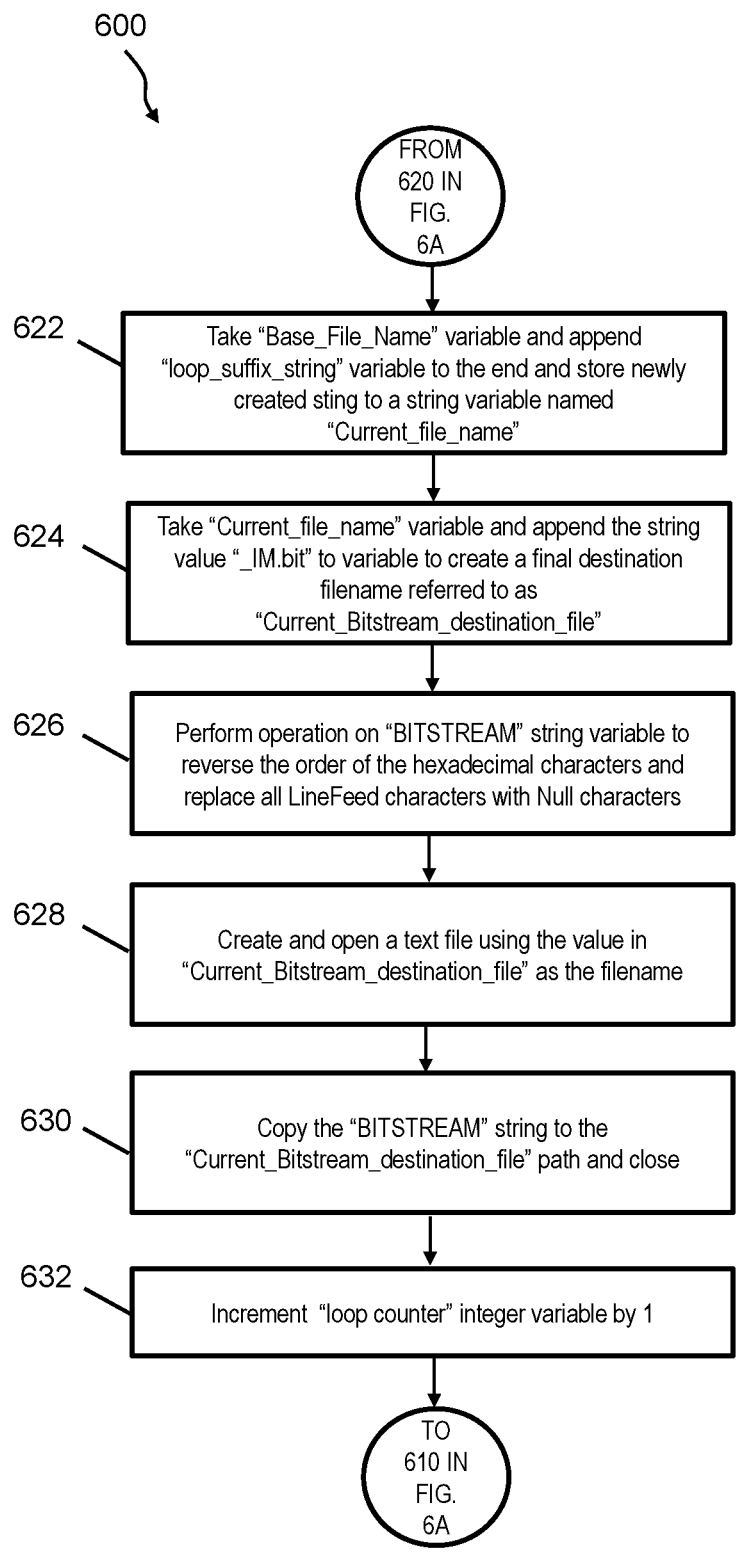

FIGS. 6A and 6B illustrate a flow diagram of a bitstream extraction process 600 (i.e., one example of the first process discussed above) according to aspects of the present disclosure. The bistream extraction process 600 may be effected using code executable by a computer, including a specialized computer configured for the process in some examples. The process 600 may, in some examples herein, be designated by "bitstream_extractor," but this is merely an exemplary naming.

As shown in FIG. 6A, method 600 starts by opening a file dialog to prompt the user to select the *.SVF file as shown at block 602. The method 600 then takes the full path and filename of the *.SVF file and strips the file extension, ".SVF" from the filename and replaces it will a null value as shown at block 604. This newly created string is stored in a string variable referred to herein as "Base_File_Name" as merely one exemplary nomenclature as further shown in block 604. The original *.SVF file is opened and all of the ASCII text is copied into a string variable referred to herein as "SVF_File_Text" as one example, then the *.SVF file is closed as shown in block 606.

The method 600 then begins a "WHILE" loop as indicated through the inclusion of decision block 610, as an example. The loop effectuates a search of the "SVF_File_Text" string variable for a BSDL configuration load command, which in this case is "SIR 5 TDI (05)" as shown by the query in decision block 610. As long as "SIR 5 TDI (05)" is found within the "SVF_File_Text" string variable, the WHILE loop will continue to execute. When "SIR 5 TDI (05)" is not found in the "SVF_File_Text" string variable the WHILE loop will terminate as shown at block 612.

When "SIR 5 TDI (05)" is found at block 610, flow proceeds to block 614 where all text occurring after the "SIR 5 TDI (05)" search string is stored into a string variable referred to herein as "after_substring" as merely an exemplary nomenclature as shown in block 614. Next, the string variable "after_substring" is then searched for the first occurrence of the open parenthesis character "(" and all text occurring after the open parenthesis character is stored into a string variable herein referred to as "temp_substring" as shown in block 616. Additionally as shown at block 616, when the close parenthesis character is found the "temp_substring" is then split into two segments. The first segment is the text that comes before the ")" character and is stored to a string variable herein referred to as "BITSTREAM". The second segment is the text that follows the ")" character.

Flow then proceeds to block 618 wherein the processes therein include overwriting the contents of the "SVF_File_Text" string variable by the contents of the second segment, which thus updates the "SVF_File_Text" string variable and readies the WHILE loop to find the next bitstream in the "SVF_File_Text." Next the value of the "loop_counter" integer variable, which is incremented on every loop iteration, is converted to a string data type and stored to a string variable herein referred to as "loop_suffix_string" as shown in block 620.

Next, as shown in the continued illustration of the flow diagram of method 600 in FIG. 6B, the "loop_suffix_string" is then appended to the end of the "Base_File_Name" string variable and this newly created string is then stored to a new string variable referred to herein as "Current_file_name" as shown at block 622. The string value, "_IM.bit" is then appended to the end of the "Current_file_name" string variable to create the final destination filename herein referred to as "Current_Bitstream_destination_file" as shown at block 624.

Next, flow proceed to block 626 where the order of the hexadecimal characters in the "BITSTREAM" string variable is reversed to make it so the least significant nibble is loaded into the FPGA first, then all line feed characters in "BITSTREAM" are replaced with null strings. Further, the file pointed to by the "Current_Bitstream_destination_file"

variable is opened as shown at block 628. The contents of the "BITSTREAM" string variable are copied into the file as shown at block 630. The file pointed to by the "Current_Bitstream_destination_file" variable is then closed as also indicated in block 630. After block 630, flow proceeds to block 632 wherein the "loop_counter" integer variable by is then incremented by '1', and the program then returns to the beginning of the WHILE loop start (i.e., decision block 610) as shown in FIG. 6A.

FIG. 7 illustrates a flow diagram of an exemplary bitstream-to-vector conversion process 700 (i.e., one example of the second process discussed above) referred to with name "bitstream2vector.vi" and which may be executable by a processor, including a specialty processor configured to perform this process. The "bitstream2vector.vi" process 700 starts by opening a file dialog window to allow the user to select any of the *.bit files generated by the "bitstream_extractor.vi" program as shown at block 702. This filename is stored as a path variable and is referred to herein as, "Bitstream_source_file" as merely one exemplary nomenclature. It is noted that method 700 allows a user to control the size of the vectors that are generated by specifying the maximum number of characters or nibbles allowed per vector. This is accomplished by a user argument herein referred to as, "Max_number_of_Characters_allowed," which is an integer variable as shown at block 704. This program also allows the user to specify a text file that contains the top line format to be used for each vector file created by this program and this user argument is herein referred to as, "Top_line_format," which is also shown at block 704. The "Bitstream_source_file" is opened and all ASCII text is copied to a string variable herein referred to as "Bit_File_Text" as shown in block 706. Additionally, the text file specified by the user argument "Top_line_format" may be opened and all ASCII text is copied to a string variable herein referred to as "Format_line" as further shown in block 706. A search and replace operation is performed on the "Bit_File_Text" string variable to replace all Line Feeds with Nulls and all white space characters are trimmed from the "Bit_File_Text" string variable as shown in block 708. The string length of the "Bit_File_Text" is measured or calculated and stored as integer variable "length" as shown at block 710. The integer variable "length" is divided by the user argument "Max_number_of_Characters_allowed" to determine the floating point variable, "Number_of_Segments" as shown in block 712. The "Number_of_Segments" floating point variable is also converted to an integer data type as shown in block 712.

The method 700 then employs, at least in this example, a nested FOR loop, where the value of "Number_of_Segments" controls the number of iterations of the outer loop and the "Max_number_of_Characters_allowed" controls the number of iterations of the inner loop. The outer FOR loop is accomplished by creating a new integer variable, "Segment_count" and initializing it to '0' as shown at block 718. Another integer variable named, "Outer_Character_count" is created to keep track of the character position from which text is retrieved from the "Bit_File_Text" string variable on each iteration. The variable "Outer_Character_count" is initialized to '0' before the outer loop as also shown at block 718. Every iteration of the outer FOR loop will increment the value in "Segment_count" and compare it to "Number_of_Segments" as shown at decision block 720. When the value of "Segment_count" becomes greater than or equal to "Number_of_Segments", the FOR loop will terminate as shown at 722. The incrementing of the value "Segment_count" is updated near the end of the outer loop as will be shown at block 774 in FIG. 7D.

Figure 7A:
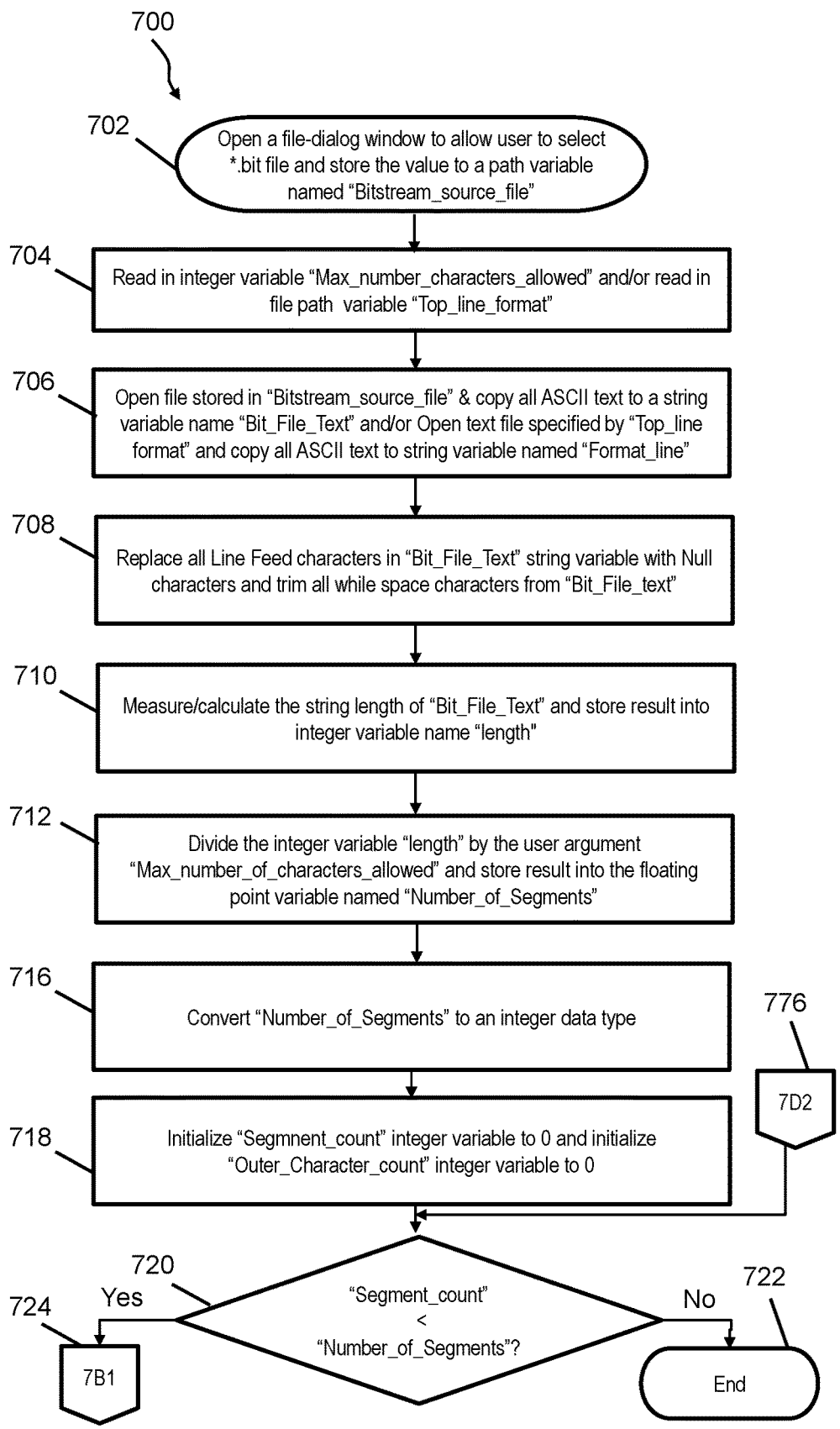
FIGS. 7A, 7B, 7C, and 7D show a flow diagram of a bitstream2vector.vi (as an exemplary nomenclature) methodology according to aspects of the present disclosure.
Figure 7B:
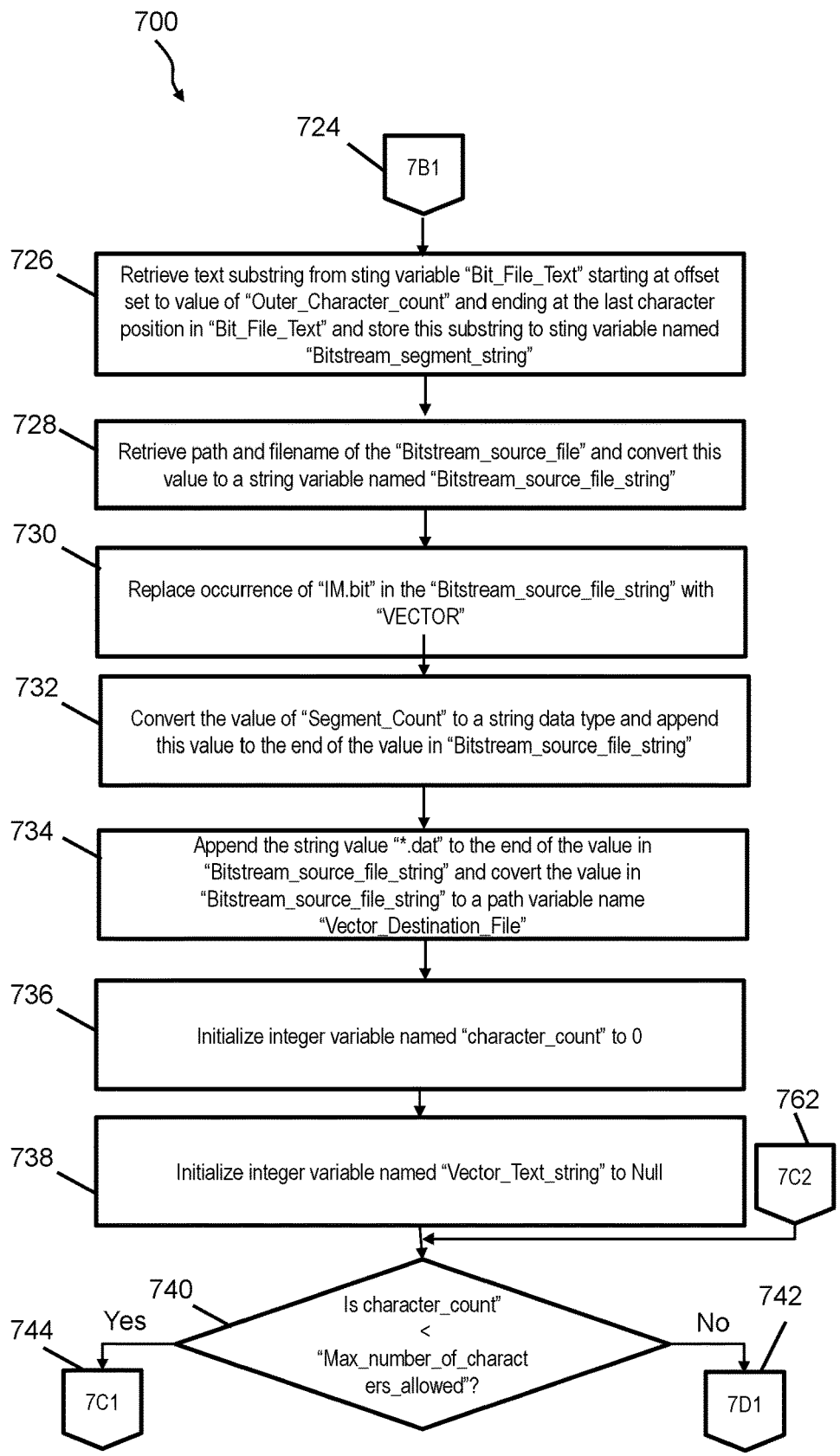
Figure 7C:
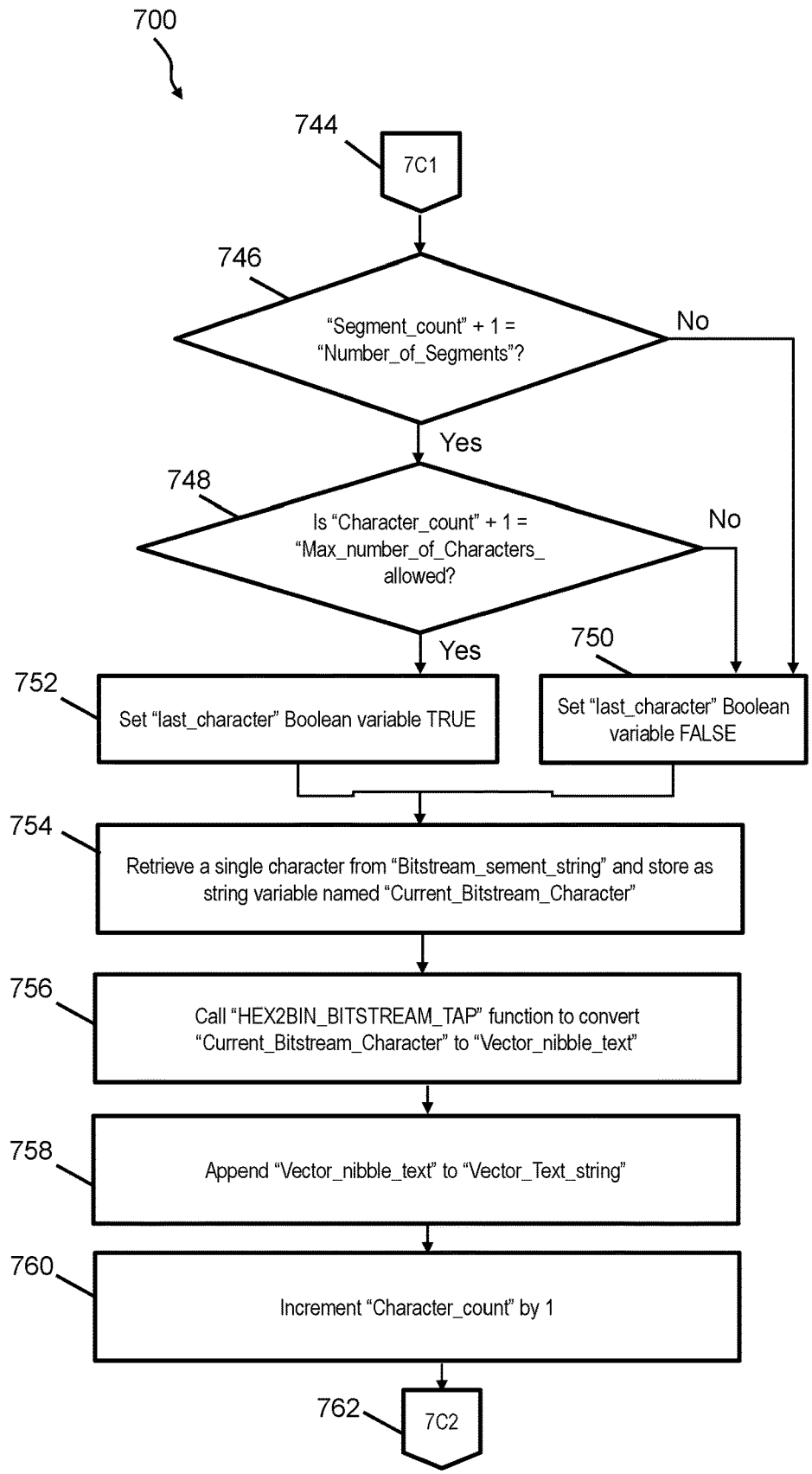

When "Segment_count" is less than "Number_of_Segments" as determined in block 720 and shown at block 724, flow proceeds to block 726 shown in FIG. 7B. At block 726, text from the string variable "Bit_File_Text" is retrieved starting with the offset set to the value of "Outer_Character_count" and ending at the last character in "Bit_File_Text". This text is then stored to a string variable herein referred to as "Bitstream_segment_string" as further shown at block 726. Next, the path and filename are retrieved from the "Bitstream_source_file" path variable and converted to a string variable, referred to herein as "Bitstream_source_file_string" as shown at block 728.

Method 700 further includes performing a search and replace operation on the "Bitstream_source_file_string" string variable to replace the occurrence of "IM.bit" with the string value "VECTOR" as shown at block 730. The value of the "Segment_count" integer variable is further converted to a string data type and appended to the end of the value in "Bitstream_source_file_string" as shown at block 732. Moreover, the string value, ".dat" is appended to the end of the value in "Bitstream_source_file_string" and this new string value is then converted to a path variable, referred to herein as a "Vector_Destination_File" as shown at block 734.

At this point in the outer loop control is transferred to the inner FOR loop. This inner FOR loop is accomplished by creating an integer variable named "Character_count" and initializing it to a value of '0' as shown at block 736. Additionally, an integer variable named "Vector_Text_string" is initializing to Null as shown at block 738. Each iteration of the inner FOR loop will increment the "Character_count" variable and compare it to the value of "Max_number_of_Characters_allowed" as will be seen from decision block 740. When the value of "Character_count" becomes greater than or equal to "Max_number_of_Characters_allowed", the inner FOR loop will return the "Vector_Text_string" variable and release program control back to the outer FOR loop as shown at block 742 (and continued in FIG. 7D). Alternatively, when the "character_count" value is less than the Max_number_of_Characters_allowed as determined at block 740, flow proceeds to block 744 continued in FIG. 7C.

Figure 8:
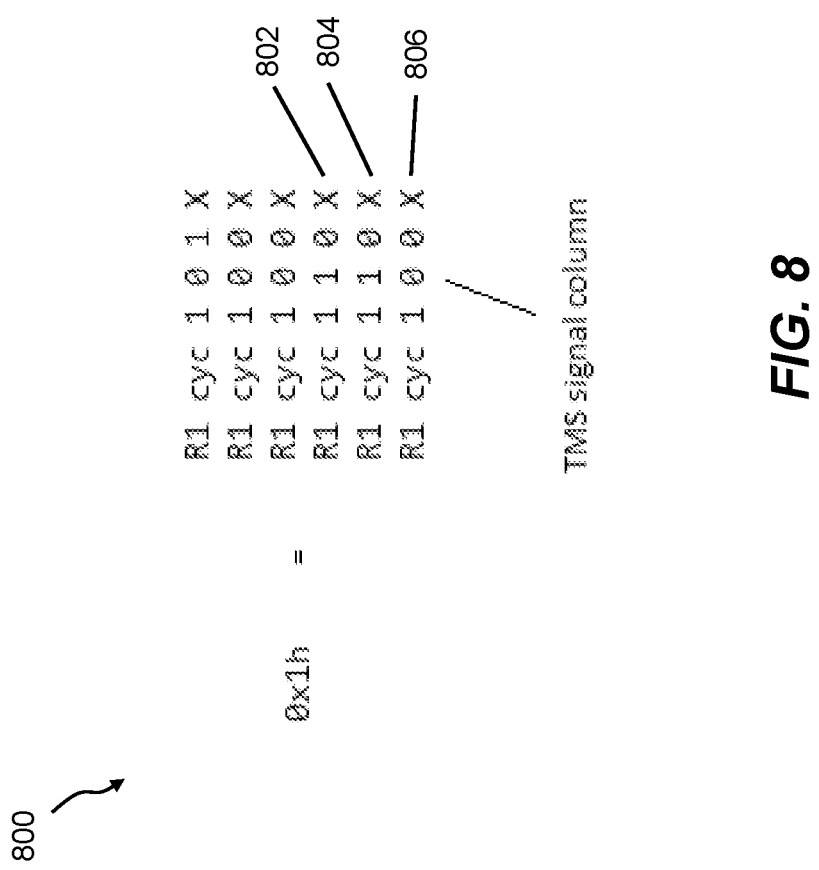
FIG. 8 shows an example of "Vector_nibble_text" variable composed of six testing system vector cycles according to aspects of the present disclosure.

It is noted that when the value "Character_count" is less than "Max_number_of_Characters_allowed", the inner loop essentially swaps a single hexadecimal character of the bitstream with a body of ASCII text that represents four HP93K clock cycles (using the example of an HP 93000 testing system, and not limited to such). For most of the hexadecimal characters, a substitution of four HP93K clock cycles will work. However, the last bit of the bitstream, which occurs on the last hexadecimal character as shown in FIG. 8, during the last segment requires the TMS signal to be asserted high to simultaneously exit the Shift-DR state and shift the final data bit shown at 802, followed by another clock cycle with TMS high to update the data register as shown at 804. A final clock cycle with TMS toggled low needs to follow to return the JTAG state machine to the "Run-Test-Idle" state as shown at 806. These special requirements for the last configuration data bit require a body of ASCII text that represents six HP93K clock cycles as shown in FIG. 8. For this reason, the inner loop has logic to detect when the program has encountered the last hexadecimal character of the last segment.

Turning back to FIG. 7C, the methodology of the inner loop logic to detect when the method has encountered the last hexadecimal character of the last segment is illustrated. This detection is accomplished by adding '1' to the "Segment_count" variable and comparing it to the "Number_of_Segments" variable as shown in decision block 746. If these two values are not equal, then the program is not currently processing the last segment and the "last character" Boolean variable is set to FALSE as shown at block 750. If these two values are equal, then it indicates the last segment is being processed and program control then proceeds to a second logic test to determine if the program has encountered the last hexadecimal character as shown at decision block 748.

The detection of the last hexadecimal character is accomplished by adding '1' to the "Character_count" variable and comparing it to the "Max_number_of_Characters_allowed" variable, which is further indicated at block 748. If these two values are not equal, then it indicates the last hexadecimal character is not being processed and the "last_character" Boolean variable is then set to FALSE as shown at block 750. If these two values are equal, then it indicates the last hexadecimal character in the last segment is being processed and the "last_character" Boolean variable is then set to TRUE as shown at block 752. Next, a single character is retrieved from "Bitstream_segment_string" variable and stored to string variable named "Current_Bitstream_Character" as shown at block 754.

The method 700 then calls a function referred to herein as, "HEX2BIN_BITSTREAM_TAP," which takes the "Current_Bitstream_Character" and "last_character" variables as arguments and returns a string variable named, "Vector_nibble_text. This call is shown at block 756 in FIG. 7C, which is a body of ASCII text representing the HP93K vector clock cycles necessary to shift a nibble of data for a single hexadecimal character.

Figure 9A:
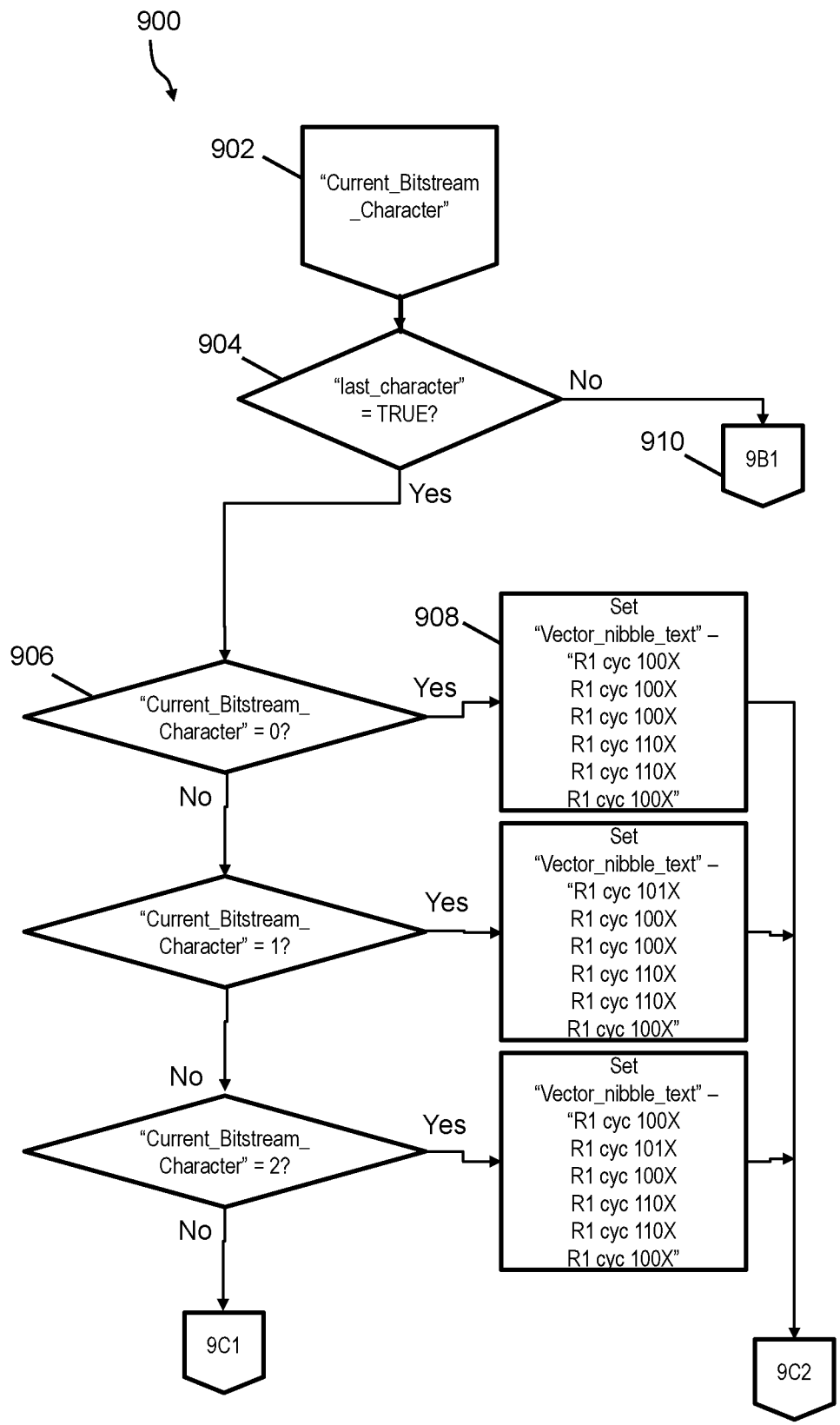
FIGS. 9A, 9B, 9C, 9D, 9E, 9F, 9G, 9H, 9I, and 9J show a further flow diagram of the hexadecimal conversion routine that may be called by the processes of FIGS. 7A-7D according to further aspects of the present disclosure.
Figure 9B:
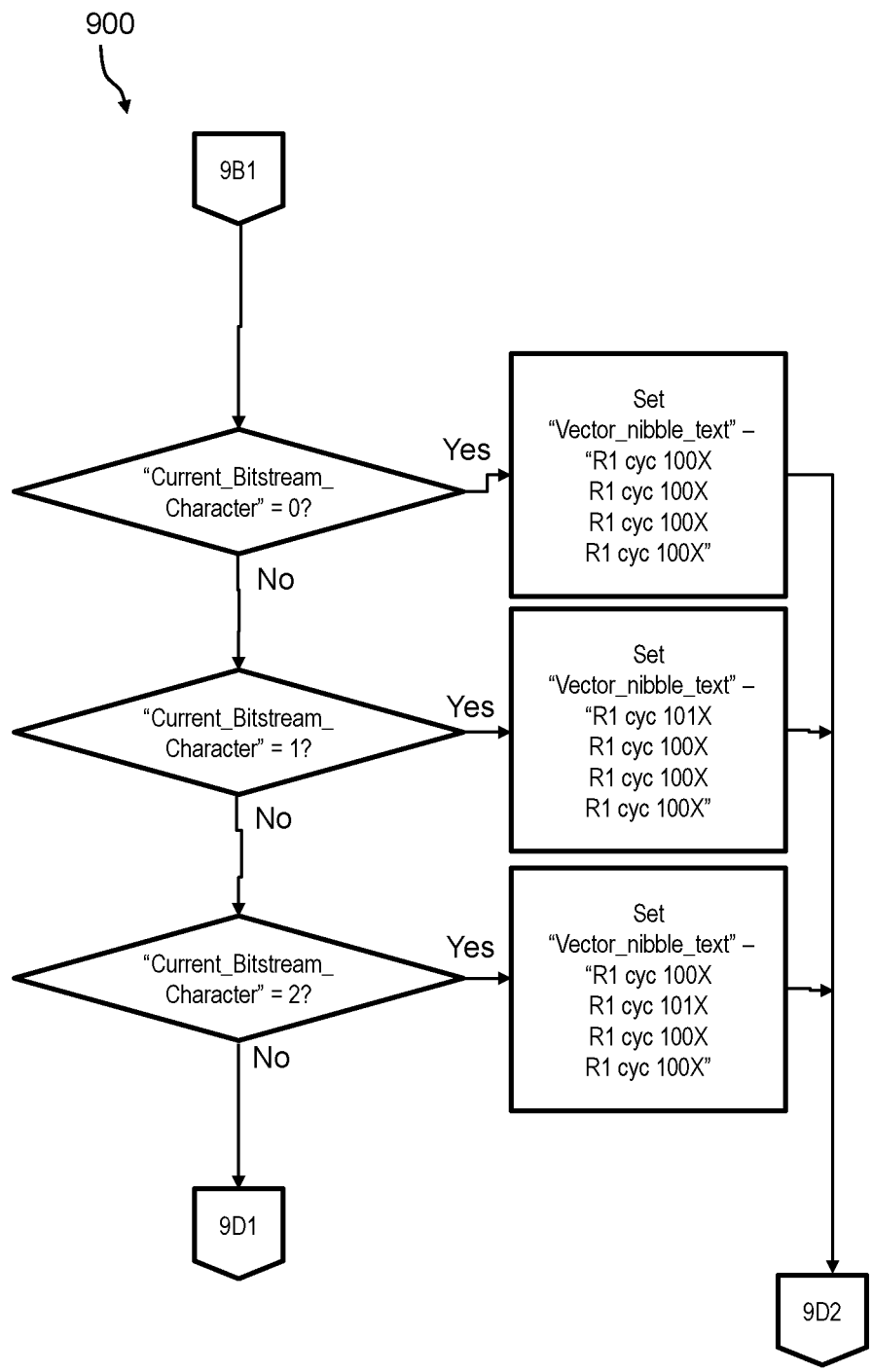
Figure 9C:
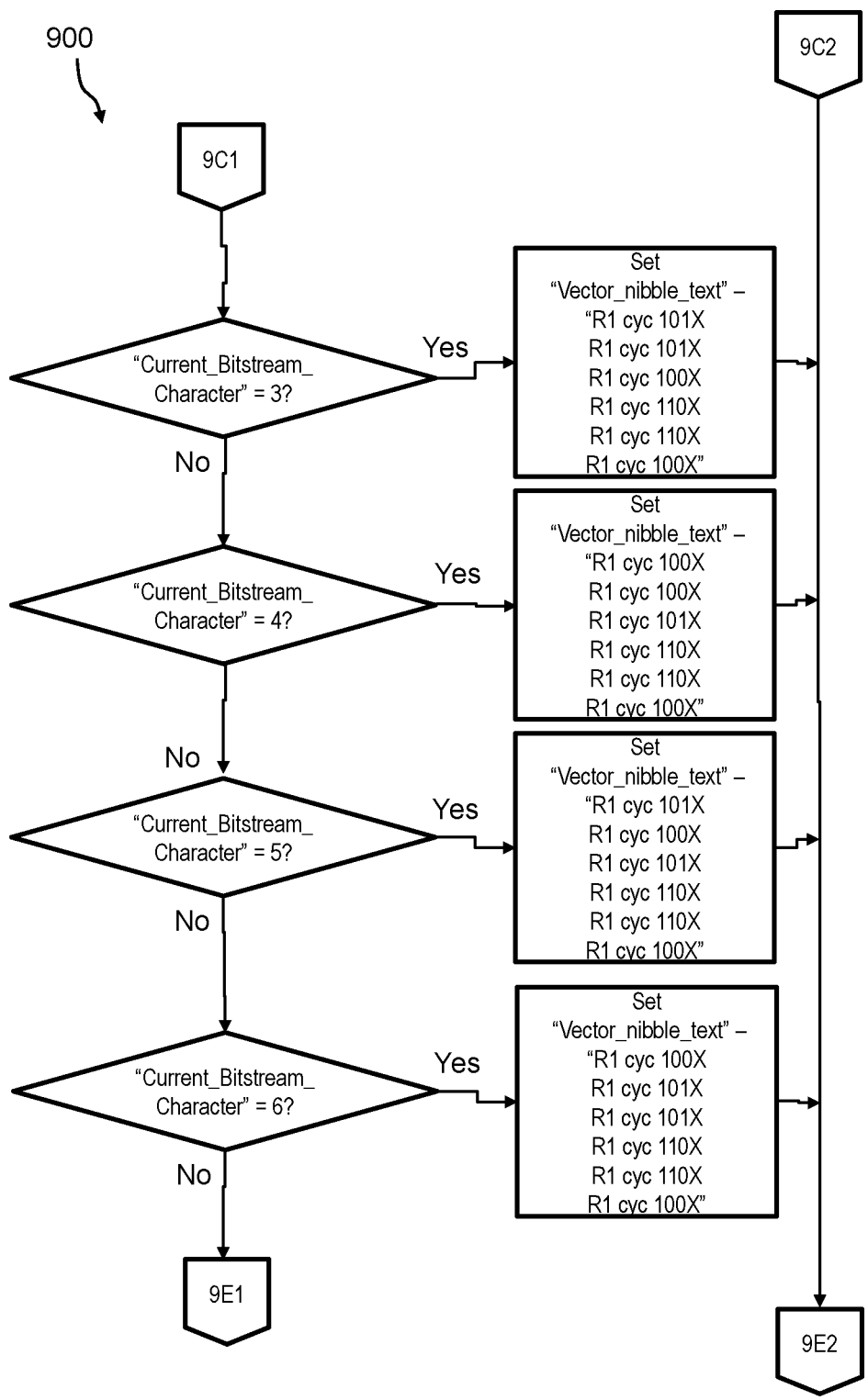
Figure 9D:
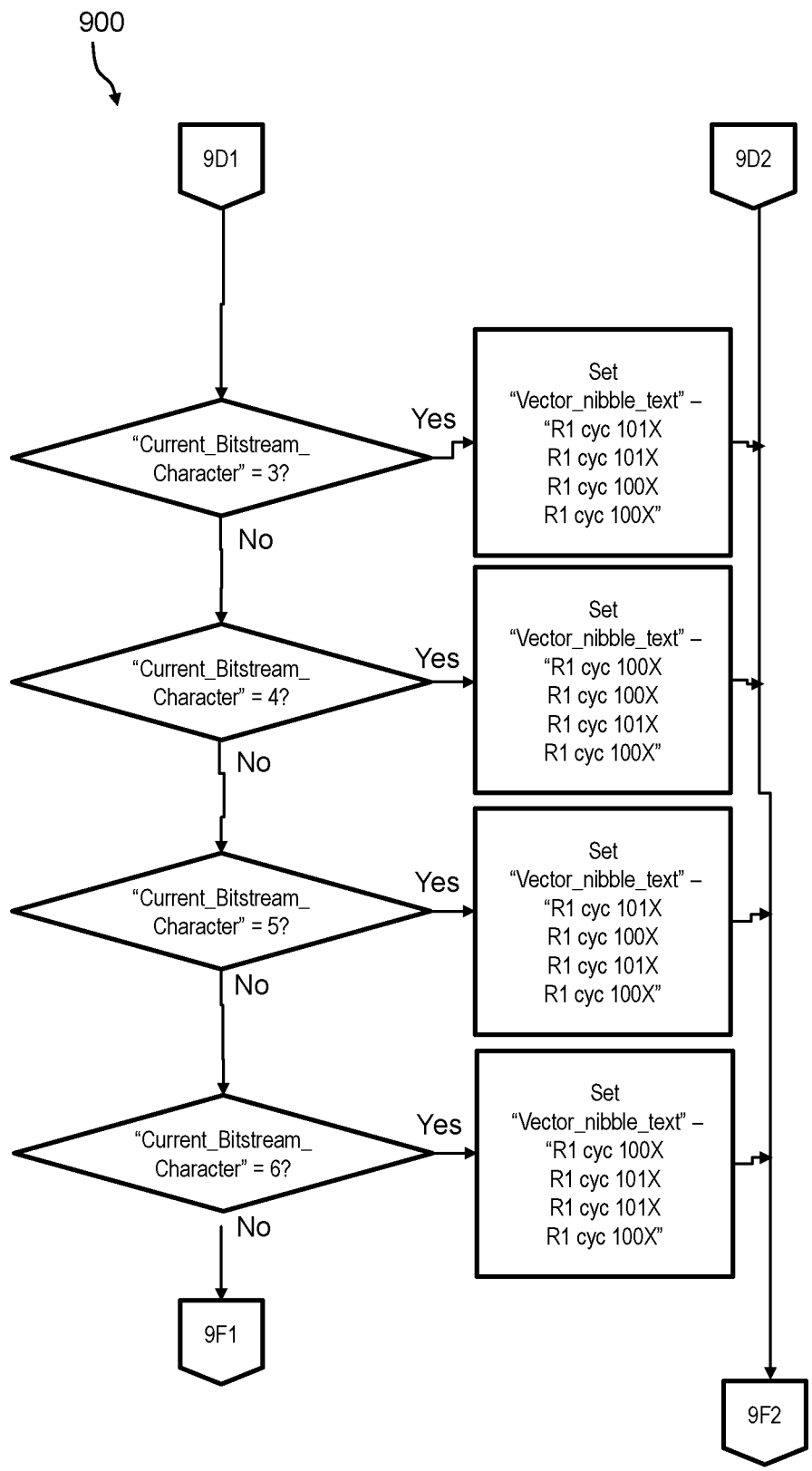
Figure 9E:
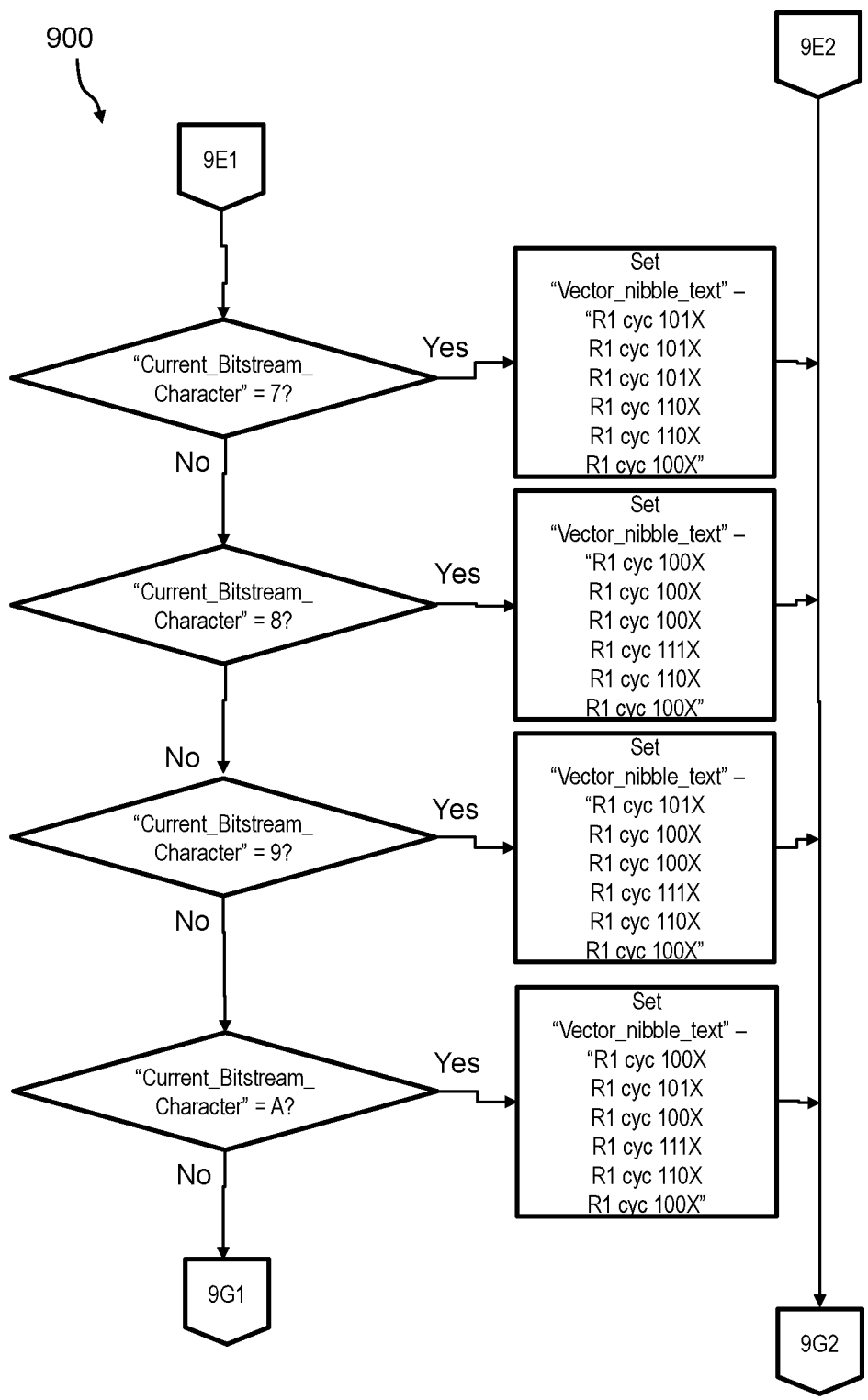
Figure 9F:
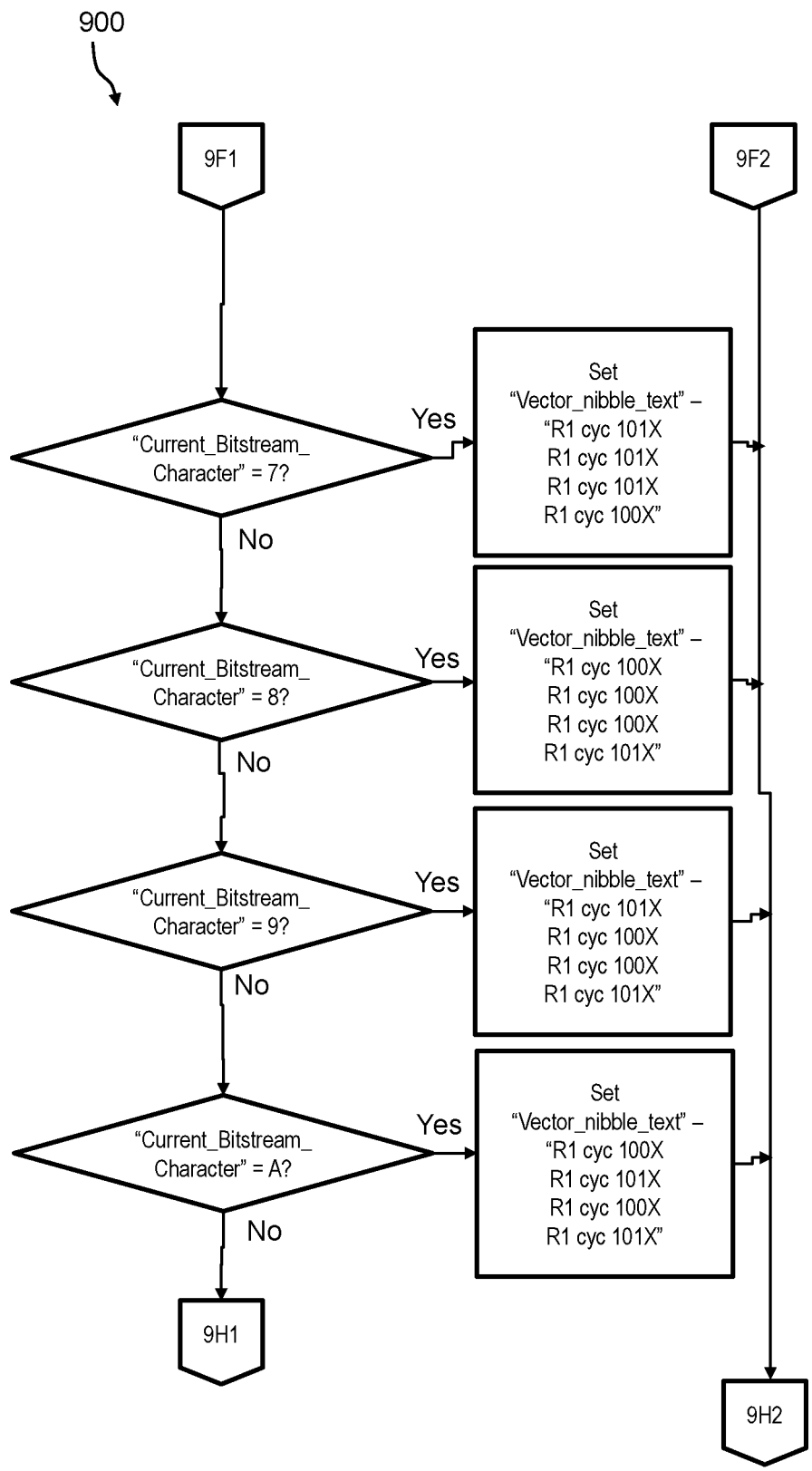
Figure 9G:
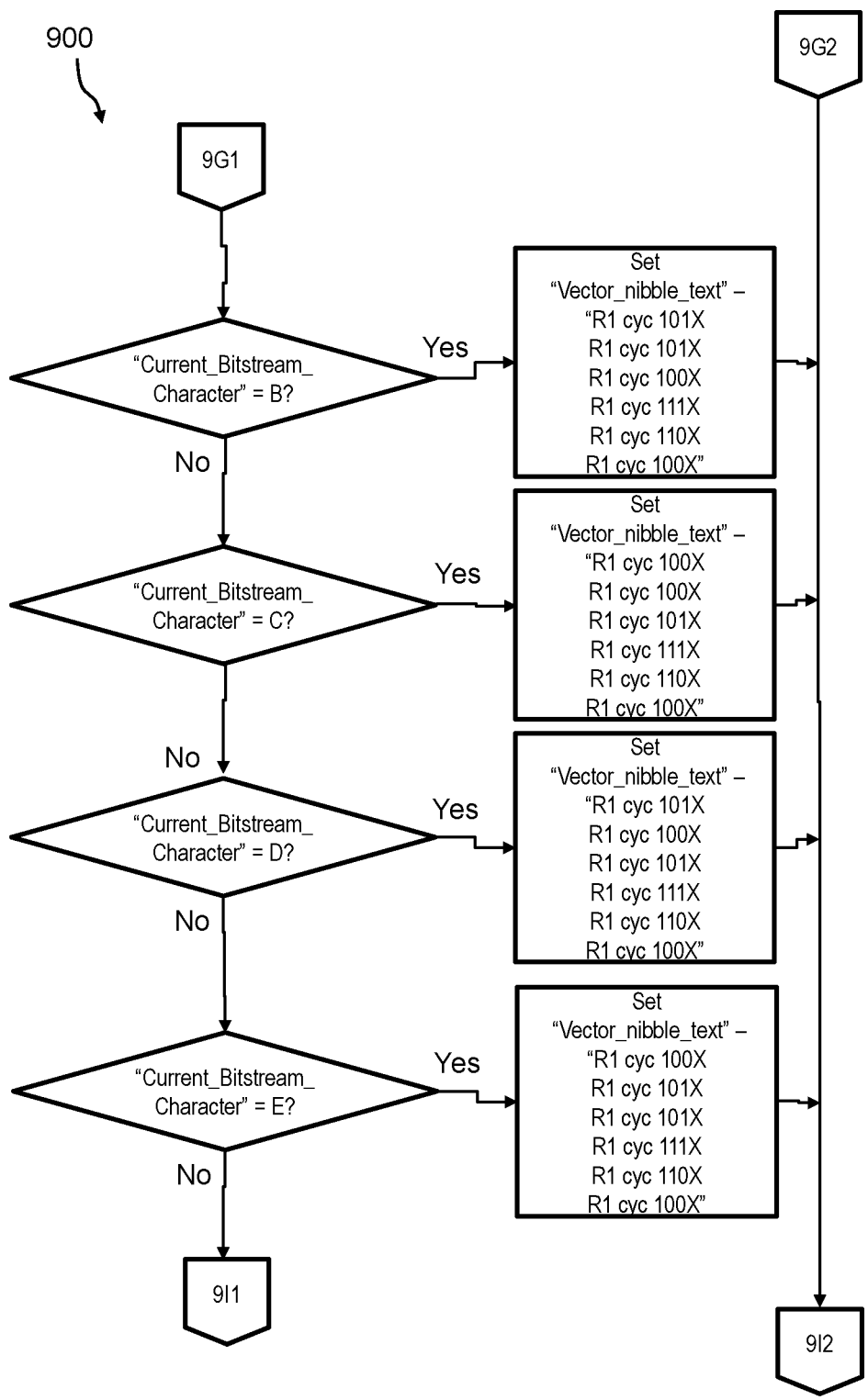
Figure 9H:
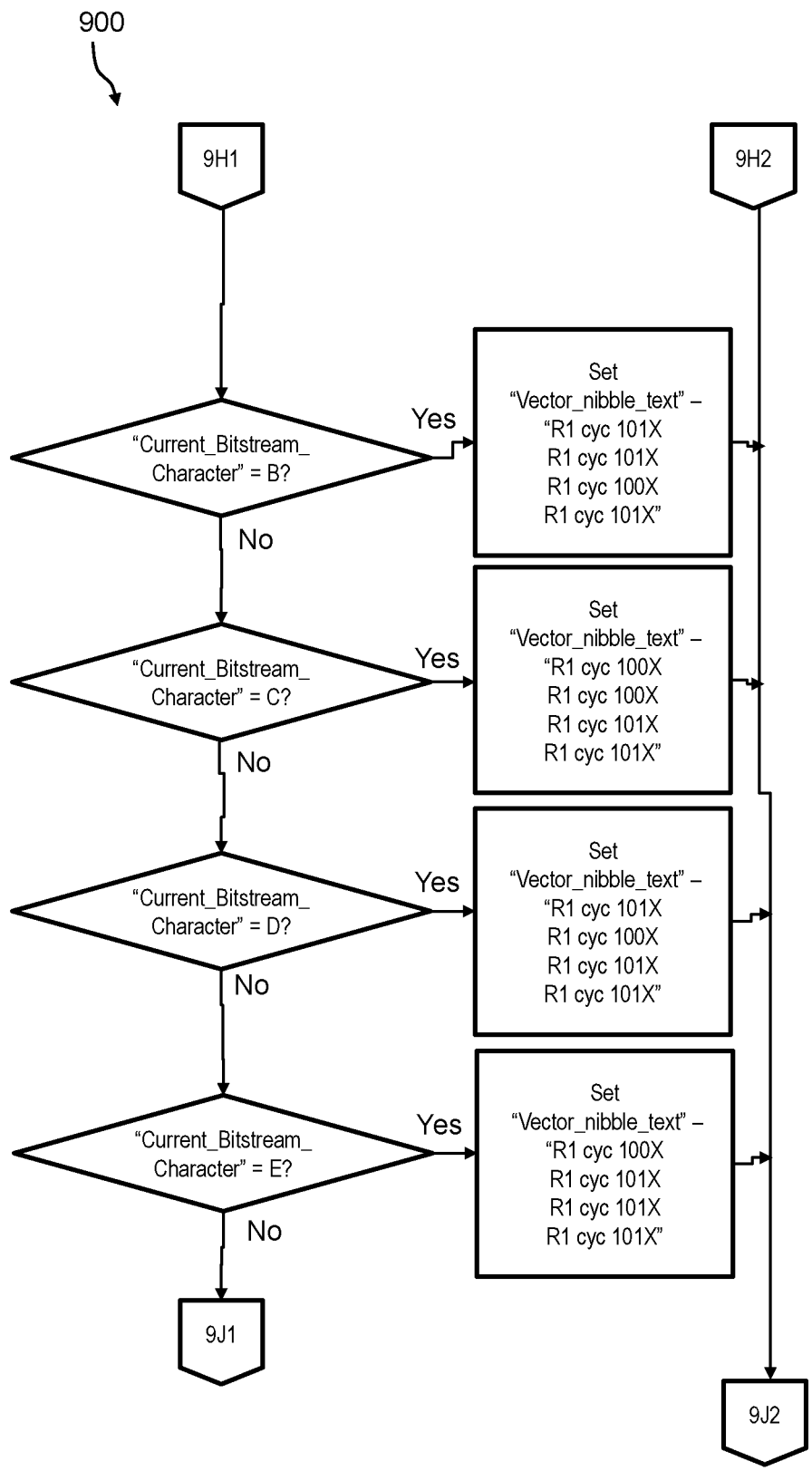
Figure 9I:
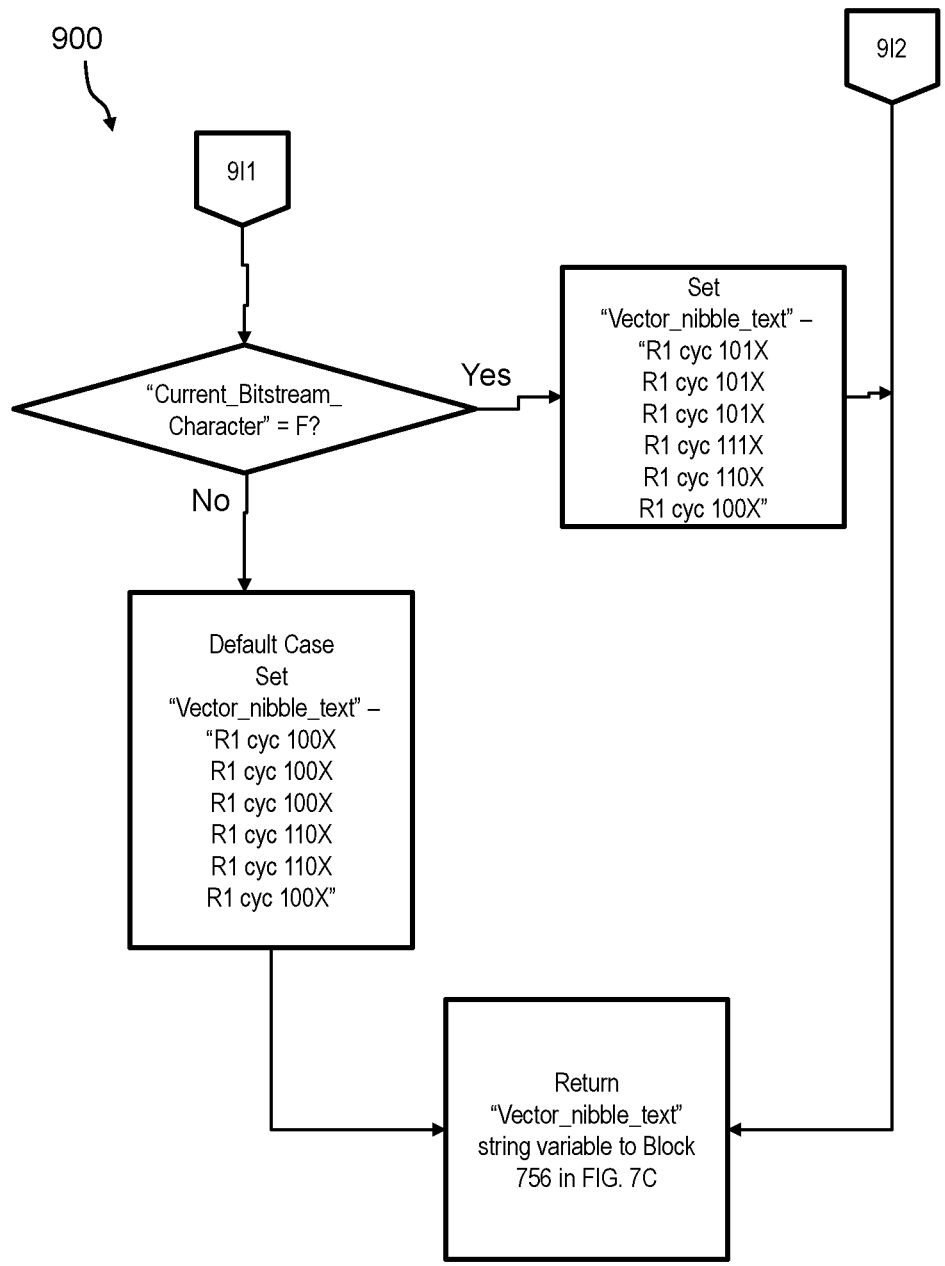
Figure 9J:
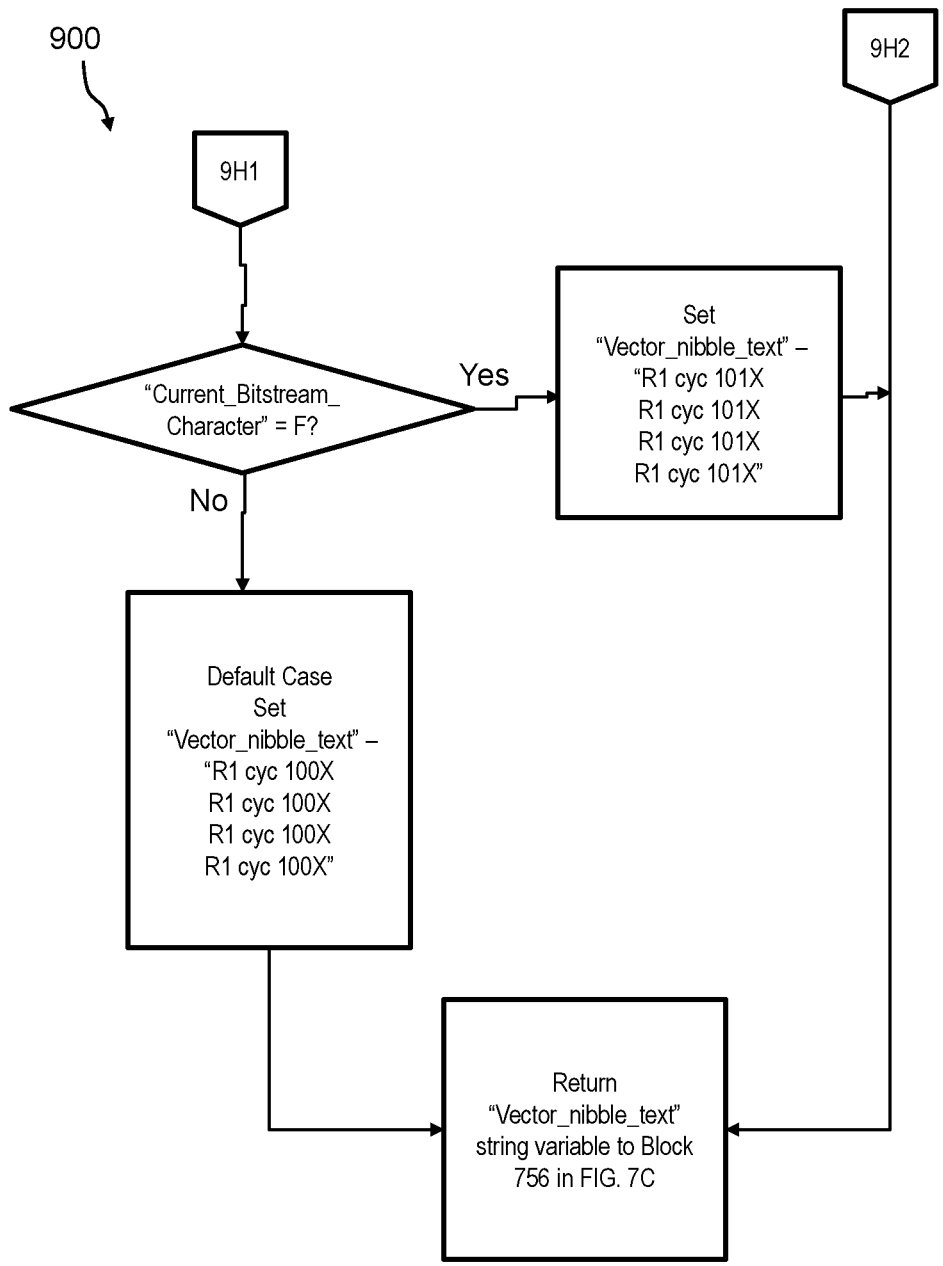

FIGS. 9A through 9J illustrate one example of the "HEX2BIN_BITSTREAM_TAP" function or method 900. This function or method 900 is comprised of an IF statement that calls the "Current_Bitstream_Character" as shown at 902 and then evaluates the logic state of the "last_character" variable as shown at decision block 904. If the logic state of the last character is TRUE as determined at decision block 904 a SELECT-CASE statement provides six HP93K vector cycles if the "last_character" variable is a certain value as determined by a string of conditional decision statements determining the bitstream character value as shown at 906 and continuing on through FIG. 9A, FIG. 9C, and FIG. 9E, and then the vector cycles provided accordingly, as shown at 908 as one example. Alternatively four HP93K vector cycles are provided if the "last_character" variable is FALSE as shown by FIG. 9B, and in sequence 9D and 9G.

Considering the case where the "Current_Bitstream_Character" is a hexadecimal "1", 0x1h the "HEX2BIN_BITSTREAM_TAP" function will evaluate the logic state of the "last_character" variable and if TRUE, the function will return the "Vector_nibble_text" variable composed of six HP93K vector cycles as shown in FIG. 9 that will: shift in a nibble of data corresponding to the hexadecimal value of "Current_Bitstream_Character", assert TMS high to exit the Shift-DR state (See 802), assert TMS high again to update the Data Register (See 804), then set TMS low to transition the JTAG state machine to the Run Test Idle mode (See 806). If the "last_character" is FALSE, the function will return the "Vector_nibble_text" variable composed of four HP93K vector cycles as shown in FIG. 10 that will shift in a nibble of data corresponding to the hexadecimal value of "Current_Bitstream_Character" and keep the TMS signal low to keep the JTAG state machine in the Shift-DR state as shown at 1002 in FIG. 10.

Turning back to FIG. 7C, for every iteration of the inner loop, the "Vector_nibble_text" string returned by the "HEX2BIN_BITSTREAM_TAP" function is appended to the "Vector_Text_string" string variable as shown at block 758. This results in a vector, or a series of vectors that will shift in a nibble of data for each hexadecimal character in the bitstream as was shown in FIG. 5. After each hexadecimal character has been processed by the inner loop, the "Character_count" integer variable is incremented by '1' as shown at block 760 and control returns to the beginning of the inner FOR loop at block 740.

Figure 7D:
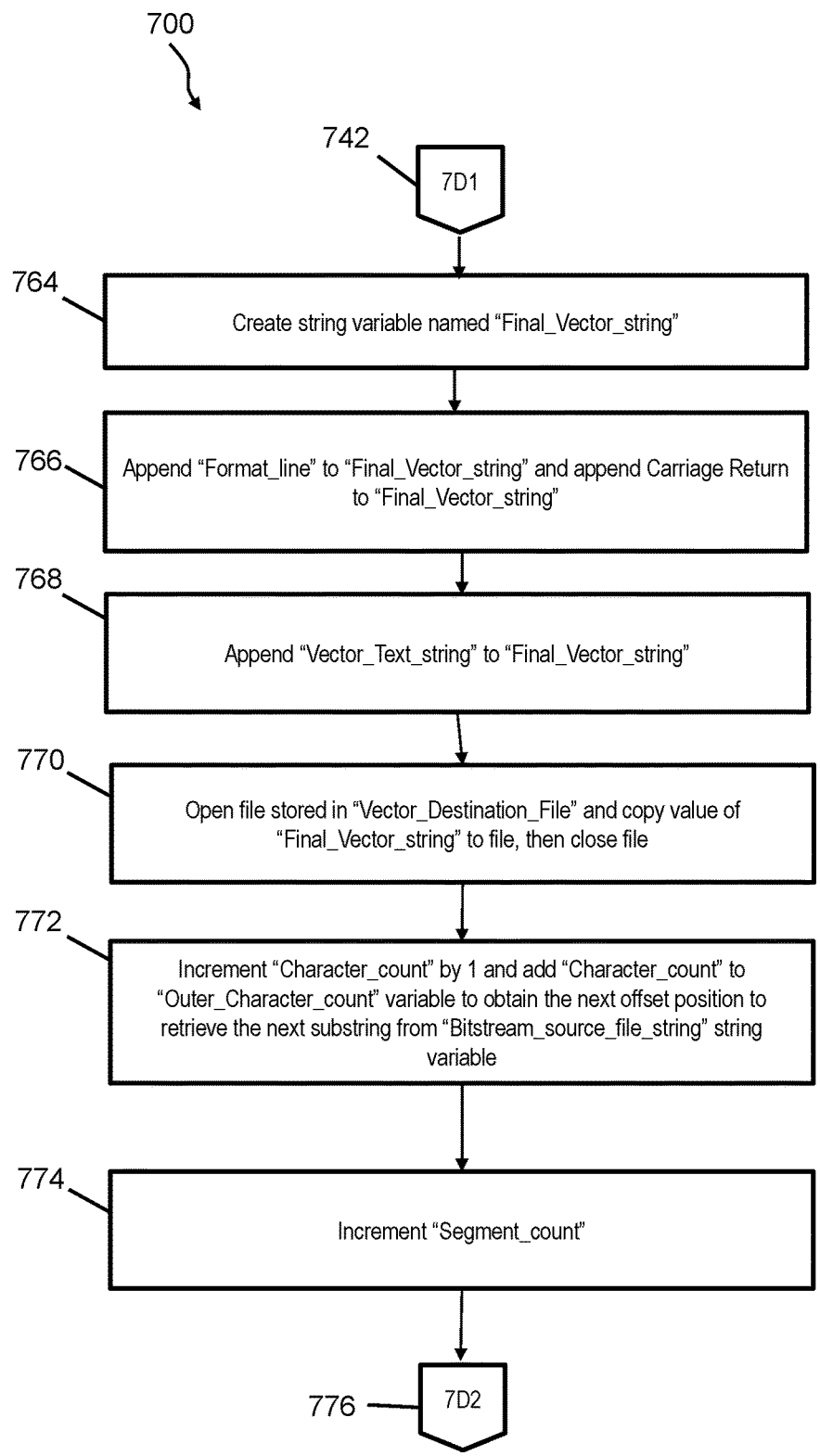

If the "Character_count" variable is equal to the "Max_number_of_Characters_allowed" as determined at block 740, then the inner FOR loop has completed its last iteration and the inner FOR loop will release the "Vector_Text_string" variable and return program control to the outer FOR loop at shown at 742 and continued on FIG. 7D. At this point program control is transferred back to the outer loop. Here, a string variable herein referred to as "Final_Vector_string" is created as shown at block 764. Next, the "Format_line" string variable is appended to the "Final_Vector_string" variable as shown at block 766. A carriage return character is then appended to the "Final_Vector_string" as shown at block 766. The "Vector_Text_string" variable is then appended to the "Final_Vector_string" variable as indicated at block 768. The file stored in "Vector_Destination_File" is opened and the contents of the "Final_Vector_string" variable are then copied to the file as shown at block 770. The "Character_count" variable is incremented by 1, and the sum is added to the "Outer_Character_count" variable to obtain the next offset position for the "Bitstream_source_file_string" as shown at block 772. The "Segment_count" variable is incremented by '1' as shown at block 774, then program control returns (block 776) to the beginning of the outer FOR loop (i.e., block 720 in FIG. 7A).

The vendor software for programming FPGAs typically supports an option to generate a Serial Vector Format File, (SVF File). The SVF file contains boundary scan instructions that are issued through the JTAG interface of the FPGA to perform programming or readback of the FPGA bitstream. By accepting the SVF file as an input and outputting an HP93K compatible vector, the software described in this patent offers an alternative method to load a bitstream into an FPGA connected to the HP93K tester. When executed from the HP93K tester, the vector issues the appropriate boundary scan instructions and bitstream data through the JTAG interface and allows the HP93K tester to replace both the vendor programming pod and vendor software.

By using the HP93K tester as the device programmer there is no longer a need to connect the vendor programming pod to FPGA when it is connected to the HP93K tester, which avoids the problem of subjecting the vendor programming pod to the same temperature conditions as the FPGA. The vectors generated by the software are issued from the HP93K tester directly to the FPGA through the JTAG interface. After the vector is generated by the software, it is merged into the HP93K vector set and stored on the HP93K workstation. The vector is tightly integrated into the instrument controller software that is part of the HP93K workstation. Whenever the bitstream is required to be loaded, the vector can be executed from the HP93K tester, which will then generate signals on the four to five JTAG device pins of the FPGA. This eliminates the need for an additional computer running the vendor software, which avoids the potential point of failure if Ethernet traffic or serial port traffic is restricted due to an IA mandate, and avoids underutilizing an expensive resource, such as an additional computer, for the sole purpose of programming an FPGA.

Presently, the methodology disclosed herein extracts the bitstream portion from the SVF file and converts it to an HP93K vector and relies on the other boundary scan vectors, such as the JTAG RESET and configuration load instruction to already exist in the HP93K vector set. However, it is possible to enhance the methodology to also generate the JTAG RESET, configuration load instruction, as well as other vectors by modifying the software to read in a BSDL, (Boundary Scan Description Language) File, which contains all of the possible boundary scan/JTAG instructions for the FPGA. As the method can be configured to parse the text in the SVF file, it can be further configured to detect which BSDL instructions are issued, then call a function to generate the corresponding HP93K JTAG vector text. For instance, any occurrence of the word "RESET" in the SVF file would initiate a call to the function, which would then generate the following JTAG RESET vector:

In an example illustrated by FIG. 11, each row represents a clock cycle. The '1' in the TCK column will generate a clock pulse for each clock cycle. A '1' in the TMS column will generate a logic high for each clock cycle and a '0' will generate a logic low. This results in a vector where the TMS signal is held high for five consecutive clock cycles, followed by a clock cycle where TMS is asserted low, which will reset the JTAG state machine then transition it to the Run Test state per the IEEE 1149 JTAG standard.

Figure 12:
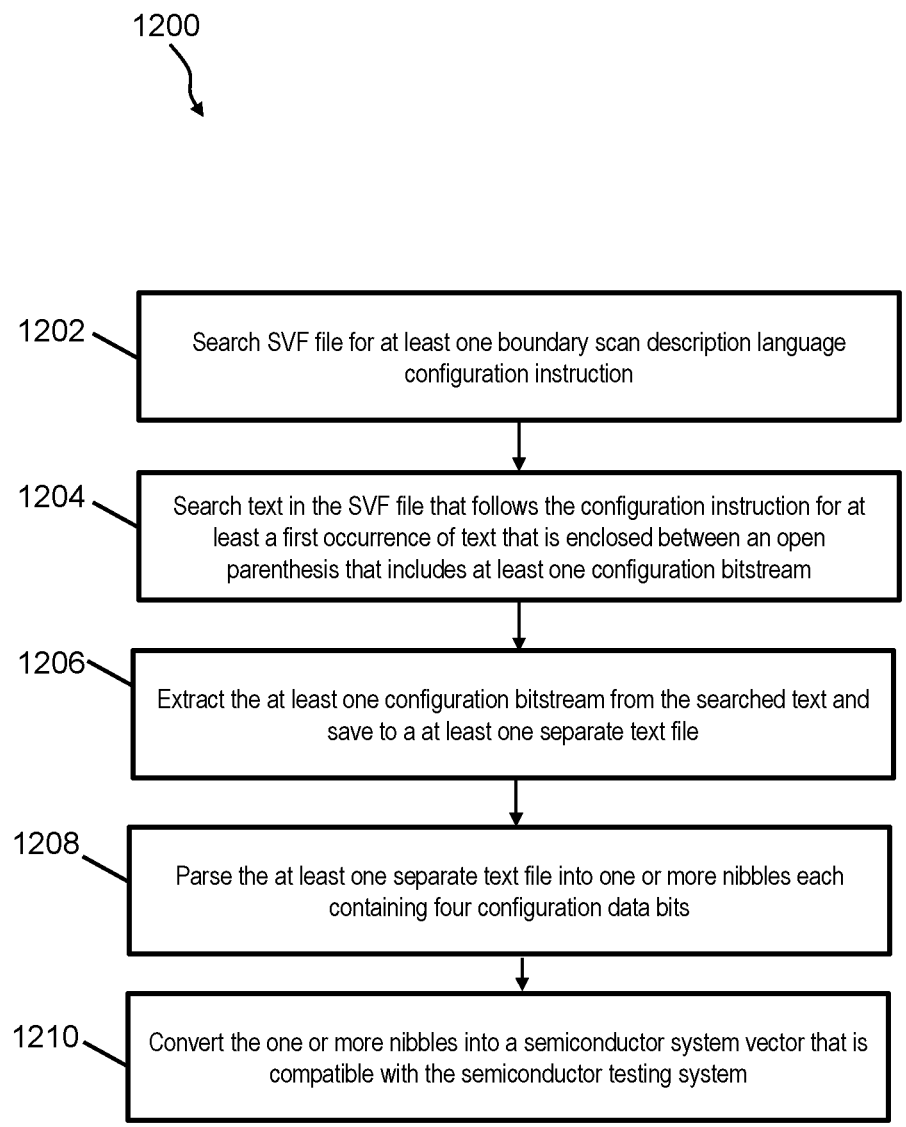
FIG. 12 illustrates another exemplary method for converting an SVF file to another vector file compatible with a semiconductor testing apparatus.

FIG. 12 illustrates a flow diagram of another exemplary method 1200 for converting an SVF vector to a vector compatible with a semiconductor testing system. As shown, method 1200 includes, after loading or reading an SVF file searching the SVF file for at least one boundary scan description language (BSDL) configuration instruction as shown at block 1202. Further, method 1200 includes searching text in the SVF file that follows the configuration instruction for at least a first occurrence of text that is enclosed between an open parenthesis that includes at least one configuration bitstream as shown at block 1204. In other aspects, equivalent text besides parenthetical characters that denote start/end of configuration bitstream(s) may be searched for.

Next, method 1200 includes extracting the at least one configuration bitstream from the searched text and save to a at least one separate text file as shown at block 1206. In block 1208, the method 1200 then includes parsing the at least one separate text file into one or more nibbles each containing four configuration data bits. Finally, method 1200 includes converting the one or more nibbles into a semiconductor system vector that is compatible with the semiconductor testing system as shown at block 1210.

In other aspects, it is noted that each nibble of the one of more nibbles comprises a series of hexadecimal characters. Additionally, each hexadecimal character represents four data bits, of a field programmable gate array (FPGA) bitstream.

In yet further aspects, the method 1200 includes that the SVF file includes a plurality of configuration bitstreams and extracting each of the plurality of configuration bitstreams and saving each of the extracted plurality of configuration bitstreams to a respective file. In yet other aspects, method 1200 includes reading in a BSDL file that contains boundary scan and Joint Test Action Group (JTAG) instructions for an FPGA, and generating one or more of a JTAG RESET or a configuration load instruction based on the BSDL file that contains the boundary scan and Joint Test Action Group (JTAG) instructions for the FPGA.

In yet more aspects, method 1200 includes that parsing the at least one separate text file further comprises detecting particular BSDL instructions, and calling a function to generate a corresponding JTAG vector text when the particular BSDL instructions are detected. In one example, the particular BSDL instructions includes the word "RESET" in the SVF file.

Method 1200 as includes that a semiconductor under test by the semiconductor testing system in an FPGA. Also, the semiconductor testing system is one of an HP93000 or a Teradyne Microflex testing system, and the semiconductor system vector may be an HP93000 vector file or other vector file compatible with other semiconductor testing systems.

Figure 13:
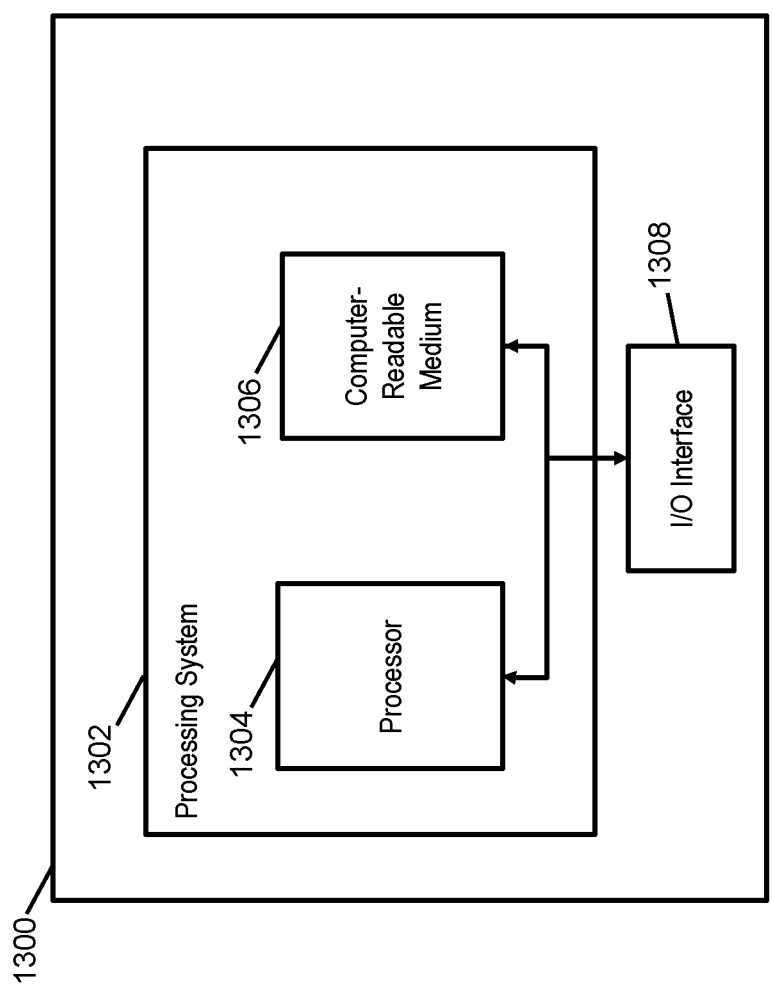
FIG. 13 illustrates a diagram of an exemplary computer system that may be employed in a semiconductor testing system to implement the disclosed methods.

In aspects, the present methods may be implemented by an apparatus that includes a computer, microcontroller, microprocessor, or specialized processor that executes computer-readable code stored on a tangible computer readable medium. An exemplary block diagram of such an apparatus 1300 that may implement the methods disclosed herein in illustrated in FIG. 13. In some aspects, apparatus 1300 may be implemented within a semiconductor testing system such as an HP93000 or a Teradyne Microflex testing system.

Apparatus 1300 includes at least one processing system 1302 including one or more processors 1304 responsible for processing, including the execution of computer executable code or software stored on a computer-readable medium 1306. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software, when executed by the processor 1304, causes the processing system 1302 to perform the various functions described above for any particular apparatus. The computer-readable medium 1306 may also be used for storing data that is manipulated by the processor 1304 when executing software.

In further aspects, the computer-readable medium 1306 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium 1306 may reside in the processing system 1302, external to the processing system 1302, or distributed across multiple entities including the processing system 1302. The transitory computer-readable medium 1306 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

Additionally, the apparatus 1300 may include an Input/Output Interface 1308 for reading in data (e.g., SVF files) and outputting processed vector files (e.g., HP93K vector files).

Although the invention has been described in detail with reference to certain preferred embodiments or examples, variations and modifications exist within the spirit and scope of the invention as described and defined in the following claims.

The invention claimed is:

1. A method for converting a serial vector format (SVF) file to operate as a semiconductor system vector for a semiconductor testing system, the method comprising:
   searching the SVF file for at least one boundary scan description language (BSDL) configuration instruction;
   searching text in the SVF file that follows the BSDL configuration instruction for at least a first occurrence of text that is enclosed between an open parenthesis that includes at least one configuration bitstream;
   extracting the at least one configuration bitstream from the searched text and save to at least one separate text file;
   parsing the at least one separate text file into one or more nibbles each containing four configuration data bits; and
   converting the one or more nibbles into a semiconductor system vector that is compatible with the semiconductor testing system.

2. The method of claim 1, wherein each nibble of the one of more nibbles comprises a series of hexadecimal characters.

3. The method of claim 2, wherein each hexadecimal character represents four data bits, of a field programmable gate array (FPGA) bitstream.

4. The method of claim 1, wherein the SVF file includes a plurality of configuration bitstreams and the method further comprises:
   extracting each of the plurality of configuration bitstreams and saving each of the extracted plurality of configuration bitstreams to a respective file.

5. The method of claim 1, further comprising:
   reading in a BSDL file that contains boundary scan and Joint Test Action Group (JTAG) instructions for an FPGA;
   generating one or more of a JTAG RESET or a configuration load instruction based on the BSDL file that contains the boundary scan and Joint Test Action Group (JTAG) instructions for the FPGA.

6. The method of claim 1, further comprising:
   wherein parsing the at least one separate text file further comprises detecting particular BSDL instructions; and
   calling a function to generate a corresponding JTAG vector text when the particular BSDL instructions are detected.

7. The method of claim 6, wherein the particular BSDL instructions includes the word "RESET" in the SVF file.

8. The method of claim 1, wherein a semiconductor under test by the semiconductor testing system in an FPGA.

9. The method of claim 1, wherein the semiconductor testing system is one of an HP93000 or a Teradyne Microflex testing system.

10. The method of claim 9, wherein the semiconductor system vector is an HP93000 vector file.

11. A non-transitory computer-readable medium storing computer executable code, the code when executed by a processor causes the processor to:
   search a serial vector format (SVF) file for at least one boundary scan description language (BSDL) configuration instruction in a semiconductor testing system;
   search text in the SVF file that follows the BSDL configuration instruction for at least a first occurrence of text that is enclosed between an open parenthesis that includes at least one configuration bitstream;
   extract the at least one configuration bitstream from the searched text and save to at least one separate text file;
   parse the at least one separate text file into one or more nibbles each containing four configuration data bits; and
   convert the one or more nibbles into a semiconductor system vector that is compatible with the semiconductor testing system.

12. The non-transitory computer-readable medium of claim 11, wherein each nibble of the one of more nibbles comprises a series of hexadecimal characters.

13. The non-transitory computer-readable medium of claim 12, wherein each hexadecimal character represents four data bits, of a field programmable gate array (FPGA) bitstream.

14. The non-transitory computer-readable medium of claim 11, wherein the SVF file includes a plurality of configuration bitstreams and the code when executed by a processor further causes the processor to:
   extract each of the plurality of configuration bitstreams and saving each of the extracted plurality of configuration bitstreams to a respective file.

15. The non-transitory computer-readable medium of claim 11, wherein the code when executed by a processor causes the processor to:
   read in a BSDL file that contains boundary scan and Joint Test Action Group (JTAG) instructions for an FPGA; and
   generate one or more of a JTAG RESET or a configuration load instruction based on the BSDL file that contains the boundary scan and Joint Test Action Group (JTAG) instructions for the FPGA.

16. The non-transitory computer-readable medium of claim 11, wherein the code when executed by a processor causes the processor to:
   parse the at least one separate text file including detecting particular BSDL instructions; and
   call a function to generate a corresponding JTAG vector text when the particular BSDL instructions are detected.

17. The non-transitory computer-readable medium of claim 16, wherein the particular BSDL instructions includes the word "RESET" in the SVF file.

18. The non-transitory computer-readable medium of claim 11, wherein a semiconductor under test by the semiconductor testing system in an FPGA.

19. The non-transitory computer-readable medium of claim 11, wherein the semiconductor testing system is one of an HP93000 or a Teradyne Microflex testing system.

20. The non-transitory computer-readable medium of claim 11, wherein the semiconductor system vector is an HP93000 vector file.

\* \* \* \* \*